(12) United States Patent
Ziemba et al.

(10) Patent No.: US 12,555,745 B2
(45) Date of Patent: Feb. 17, 2026

(54) APPARATUS AND METHOD OF GENERATING A WAVEFORM

(71) Applicant: Eagle Harbor Technologies, Inc., Seattle, WA (US)

(72) Inventors: Timothy M. Ziemba, Bainbridge Island, WA (US); Kenneth E. Miller, Seattle, WA (US); John G. Carscadden, Seattle, WA (US); James R. Prager, Seattle, WA (US); Ilia Slobodov, Seattle, WA (US)

(73) Assignee: Eagle Harbor Technologies, Inc., Seattle, WA (US)

( * ) Notice: Subject to any disclaimer, the term of this patent is extended or adjusted under 35 U.S.C. 154(b) by 192 days.

(21) Appl. No.: 18/321,724

(22) Filed: May 22, 2023

(65) Prior Publication Data
US 2024/0055227 A1 Feb. 15, 2024

Related U.S. Application Data

(63) Continuation of application No. 17/834,933, filed on Jun. 8, 2022, now Pat. No. 11,658,007, which is a
(Continued)

(51) Int. Cl.
*H01J 37/32* (2006.01)
*H03K 3/017* (2006.01)
*H03K 3/57* (2006.01)

(52) U.S. Cl.
CPC .. *H01J 37/32146* (2013.01); *H01J 37/32128* (2013.01); *H03K 3/017* (2013.01); *H03K 3/57* (2013.01); *H01J 2237/2485* (2013.01)

(58) Field of Classification Search
None
See application file for complete search history.

(56) References Cited

U.S. PATENT DOCUMENTS

| 3,339,108 A | 8/1967 | Holtje |
| 4,070,589 A | 1/1978 | Martinkovic |

(Continued)

FOREIGN PATENT DOCUMENTS

| CA | 2292526 A1 | 12/1999 |
| CN | 101534071 A | 9/2009 |

(Continued)

OTHER PUBLICATIONS

Final Office Action in U.S. Appl. No. 15/623,464, dated Mar. 27, 2018, 18 pages.
(Continued)

*Primary Examiner* — Anh Q Tran

(57) ABSTRACT

Some embodiments include a high voltage waveform generator comprising: a generator inductor; a high voltage nanosecond pulser having one or more solid state switches electrically and/or inductively coupled with the generator inductor, the high voltage nanosecond pulser configured to produce a pulse burst having a burst period, the pulse burst comprising a plurality of pulses having different pulse widths; and a load electrically and/or inductively coupled with the high voltage nanosecond pulser, the generator inductor, and the generator capacitor, the voltage across the load having an output pulse with a pulse width substantially equal to the burst period and the voltage across the load varying in a manner that is substantially proportional with the pulse widths of the plurality of pulses.

13 Claims, 20 Drawing Sheets

Related U.S. Application Data continuation of application No. 16/941,532, filed on Jul. 29, 2020, now Pat. No. 11,387,076, which is a continuation of application No. 16/722,085, filed on Dec. 20, 2019, now Pat. No. 10,777,388, which is a continuation of application No. 16/114,195, filed on Aug. 27, 2018, now Pat. No. 10,304,661.

(60) Provisional application No. 62/553,187, filed on Sep. 1, 2017, provisional application No. 62/550,251, filed on Aug. 25, 2017.

(56) References Cited

U.S. PATENT DOCUMENTS

| | | |
|---|---|---|
| 4,076,996 A | 2/1978 | Maehara et al. |
| 4,438,331 A | 3/1984 | Davis |
| 4,504,895 A | 3/1985 | Steigerwald |
| 4,885,074 A | 12/1989 | Susko et al. |
| 4,924,191 A | 5/1990 | Erb et al. |
| 4,992,919 A | 2/1991 | Lee et al. |
| 5,072,191 A | 12/1991 | Nakajima et al. |
| 5,118,969 A | 6/1992 | Ikezi et al. |
| 5,140,510 A | 8/1992 | Myers |
| 5,313,481 A | 5/1994 | Cook et al. |
| 5,321,597 A | 6/1994 | Alacoque |
| 5,325,021 A | 6/1994 | Duckworth et al. |
| 5,392,043 A | 2/1995 | Ribner |
| 5,418,707 A | 5/1995 | Shimer et al. |
| 5,451,846 A | 9/1995 | Peterson et al. |
| 5,488,552 A | 1/1996 | Sakamoto et al. |
| 5,610,452 A | 3/1997 | Shimer et al. |
| 5,623,171 A | 4/1997 | Nakajima |
| 5,629,844 A | 5/1997 | Krichtafovitch et al. |
| 5,656,123 A | 8/1997 | Salimian et al. |
| 5,729,562 A | 3/1998 | Birx et al. |
| 5,796,598 A | 8/1998 | Nowak et al. |
| 5,808,504 A | 9/1998 | Chikai et al. |
| 5,835,367 A | 11/1998 | Pan et al. |
| 5,905,646 A | 5/1999 | Crewson et al. |
| 5,930,125 A | 7/1999 | Hitchcock et al. |
| 5,933,335 A | 8/1999 | Hitchcock et al. |
| 5,968,377 A | 10/1999 | Yuasa et al. |
| 6,059,935 A | 5/2000 | Spence |
| 6,066,901 A | 5/2000 | Burkhart et al. |
| 6,087,871 A | 7/2000 | Kardo-Syssoev et al. |
| 6,205,074 B1 | 3/2001 | Van Buskirk et al. |
| 6,222,321 B1 | 4/2001 | Scholl et al. |
| 6,233,161 B1 | 5/2001 | Balakrishnan et al. |
| 6,238,387 B1 | 5/2001 | Miller, III |
| 6,253,704 B1 | 7/2001 | Savas |
| 6,359,542 B1 | 3/2002 | Widmayer et al. |
| 6,362,604 B1 | 3/2002 | Cravey |
| 6,392,187 B1 | 5/2002 | Johnson |
| 6,416,638 B1 | 7/2002 | Kuriyama et al. |
| 6,480,399 B2 | 11/2002 | Balakrishnan et al. |
| 6,483,731 B1 | 11/2002 | Isurin et al. |
| 6,496,047 B1 | 12/2002 | Iskander et al. |
| 6,518,195 B1 | 2/2003 | Collins et al. |
| 6,577,135 B1 | 6/2003 | Matthews et al. |
| 6,741,120 B1 | 5/2004 | Tan |
| 6,741,484 B2 | 5/2004 | Crewson et al. |
| 6,831,377 B2 | 12/2004 | Yampolsky et al. |
| 6,897,574 B2 | 5/2005 | Vaysse |
| 6,947,300 B2 | 9/2005 | Pai et al. |
| 7,061,230 B2 | 6/2006 | Kleine et al. |
| 7,180,082 B1 | 2/2007 | Hassanein et al. |
| 7,256,637 B2 | 8/2007 | Iskander et al. |
| 7,291,545 B2 | 11/2007 | Collins et al. |
| 7,307,375 B2 | 12/2007 | Smith et al. |
| 7,319,579 B2 | 1/2008 | Inoue et al. |
| 7,354,501 B2 | 4/2008 | Gondhalekar et al. |
| 7,393,765 B2 | 7/2008 | Hanawa et al. |
| 7,396,746 B2 | 7/2008 | Walther et al. |
| 7,492,138 B2 | 2/2009 | Zhang et al. |
| 7,512,433 B2 | 3/2009 | Bernhart et al. |
| 7,521,370 B2 | 4/2009 | Hoffaman |
| 7,601,619 B2 | 10/2009 | Okumura et al. |
| 7,605,385 B2 | 10/2009 | Bauer |
| 7,767,433 B2 | 8/2010 | Kuthi et al. |
| 7,901,930 B2 | 3/2011 | Kuthi et al. |
| 7,936,544 B2 | 5/2011 | Beland |
| 7,948,185 B2 | 5/2011 | Smith et al. |
| 7,989,987 B2 | 8/2011 | McDonald |
| 8,093,979 B2 | 1/2012 | Wilson |
| 8,115,343 B2 | 2/2012 | Sanders et al. |
| 8,129,653 B2 | 3/2012 | Kirchmeier et al. |
| 8,143,790 B2 | 3/2012 | Smith et al. |
| 8,222,936 B2 | 7/2012 | Friedman et al. |
| 8,259,476 B2 | 9/2012 | Ben-Yaakov et al. |
| 8,410,889 B2 | 4/2013 | Garrity et al. |
| 8,436,602 B2 | 5/2013 | Sykes |
| 8,450,985 B2 | 5/2013 | Gray et al. |
| 8,575,843 B2 | 11/2013 | Moore et al. |
| 8,723,591 B2 | 5/2014 | Lee et al. |
| 8,773,184 B1 | 7/2014 | Petrov et al. |
| 8,828,254 B2 | 9/2014 | Inoue et al. |
| 8,847,433 B2 | 9/2014 | Vandermey |
| 8,963,377 B2 | 2/2015 | Ziemba et al. |
| 9,067,788 B1 | 6/2015 | Spielman et al. |
| 9,070,396 B1 | 6/2015 | Katchmart et al. |
| 9,084,334 B1 | 7/2015 | Gefter et al. |
| 9,122,350 B2 | 9/2015 | Kao et al. |
| 9,122,360 B2 | 9/2015 | Xu et al. |
| 9,287,086 B2 | 3/2016 | Brouk et al. |
| 9,287,092 B2 | 3/2016 | Brouk et al. |
| 9,306,533 B1 | 4/2016 | Mavretic |
| 9,329,256 B2 | 5/2016 | Dolce |
| 9,349,603 B2 | 5/2016 | Inoue et al. |
| 9,417,739 B2 | 8/2016 | Cordeiro et al. |
| 9,435,029 B2 | 9/2016 | Brouk et al. |
| 9,493,765 B2 | 11/2016 | Krishnaswamy et al. |
| 9,601,283 B2 | 3/2017 | Ziemba et al. |
| 9,706,630 B2 | 7/2017 | Miller et al. |
| 9,767,988 B2 | 9/2017 | Brouk et al. |
| 9,811,119 B2 | 11/2017 | Seo |
| 9,960,763 B2 | 5/2018 | Miller et al. |
| 9,966,231 B2 | 5/2018 | Boswell et al. |
| 10,009,024 B2 | 6/2018 | Gan et al. |
| 10,020,800 B2 | 7/2018 | Prager et al. |
| 10,027,314 B2 | 7/2018 | Prager et al. |
| 10,044,278 B2 | 8/2018 | Kondo et al. |
| 10,224,822 B2 | 3/2019 | Miller et al. |
| 10,301,587 B2 | 5/2019 | Krishnaswamy et al. |
| 10,304,661 B2 | 5/2019 | Ziemba et al. |
| 10,373,755 B2 | 8/2019 | Prager et al. |
| 10,373,804 B2 | 8/2019 | Koh et al. |
| 10,382,022 B2 | 8/2019 | Prager et al. |
| 10,448,494 B1 | 10/2019 | Dorf et al. |
| 10,448,495 B1 | 10/2019 | Dorf et al. |
| 10,460,910 B2 | 10/2019 | Ziemba et al. |
| 10,460,911 B2 | 10/2019 | Ziemba et al. |
| 10,483,089 B2 | 11/2019 | Ziemba et al. |
| 10,555,412 B2 | 2/2020 | Dorf et al. |
| 10,600,619 B2 | 3/2020 | Inoue et al. |
| 10,607,814 B2 | 3/2020 | Ziemba et al. |
| 10,659,019 B2 | 5/2020 | Slobodov et al. |
| 10,707,864 B2 | 7/2020 | Miller et al. |
| 10,734,906 B2 | 8/2020 | Miller et al. |
| 10,777,388 B2 | 9/2020 | Ziemba et al. |
| 10,791,617 B2 | 9/2020 | Dorf et al. |
| 10,796,887 B2 | 10/2020 | Prager et al. |
| 10,811,230 B2 | 10/2020 | Ziemba et al. |
| 10,892,140 B2 | 1/2021 | Ziemba et al. |
| 10,892,141 B2 | 1/2021 | Ziemba et al. |
| 10,978,955 B2 | 4/2021 | Ziemba et al. |
| 10,978,995 B2 | 4/2021 | Itasaka et al. |
| 10,985,740 B2 | 4/2021 | Prager et al. |
| 11,004,660 B2 | 5/2021 | Prager et al. |
| 11,101,108 B2 | 8/2021 | Slobodov et al. |
| 11,171,568 B2 | 11/2021 | Miller et al. |
| 11,222,767 B2 | 1/2022 | Ziemba et al. |
| 11,284,500 B2 | 3/2022 | Dorf et al. |

(56) References Cited

U.S. PATENT DOCUMENTS

| | | |
|---|---|---|
| 11,658,007 B2 * | 5/2023 | Ziemba .................. H03K 3/57 315/224 |
| 11,689,107 B2 | 6/2023 | Ziemba et al. |
| 2001/0008552 A1 | 7/2001 | Harada et al. |
| 2002/0016617 A1 | 2/2002 | Oldham |
| 2002/0140464 A1 | 10/2002 | Yampolsky et al. |
| 2002/0180276 A1 | 12/2002 | Sakuma et al. |
| 2002/0186577 A1 | 12/2002 | Kirbie |
| 2003/0021125 A1 | 1/2003 | Rufer et al. |
| 2003/0021131 A1 | 1/2003 | Nadot et al. |
| 2003/0054647 A1 | 3/2003 | Suemasa et al. |
| 2003/0071035 A1 | 4/2003 | Brailove |
| 2003/0137791 A1 | 7/2003 | Arnet et al. |
| 2003/0169107 A1 | 9/2003 | LeChevalier |
| 2003/0227280 A1 | 12/2003 | Vinciarelli |
| 2004/0085784 A1 | 5/2004 | Salama et al. |
| 2004/0149217 A1 | 8/2004 | Collins et al. |
| 2004/0263412 A1 | 12/2004 | Pribyl |
| 2005/0152159 A1 | 7/2005 | Isurin et al. |
| 2005/0270096 A1 | 12/2005 | Coleman |
| 2005/0286273 A1 | 12/2005 | Ferencz |
| 2006/0187607 A1 | 8/2006 | Mo |
| 2006/0192774 A1 | 8/2006 | Yasumura |
| 2006/0210020 A1 | 9/2006 | Takahashi et al. |
| 2006/0274887 A1 | 12/2006 | Sakamoto et al. |
| 2007/0018504 A1 | 1/2007 | Wiener et al. |
| 2007/0114981 A1 | 5/2007 | Vasquez et al. |
| 2007/0115705 A1 | 5/2007 | Gotzenberger et al. |
| 2007/0212811 A1 | 9/2007 | Hanawa et al. |
| 2008/0062733 A1 | 3/2008 | Gay |
| 2008/0106151 A1 | 5/2008 | Ryoo et al. |
| 2008/0143260 A1 | 6/2008 | Tuymer |
| 2008/0198634 A1 | 8/2008 | Scheel et al. |
| 2008/0231337 A1 | 9/2008 | Krishnaswamy et al. |
| 2008/0252225 A1 | 10/2008 | Kurachi et al. |
| 2008/0272706 A1 | 11/2008 | Kwon et al. |
| 2009/0016549 A1 | 1/2009 | French et al. |
| 2009/0108759 A1 | 4/2009 | Tao et al. |
| 2009/0322307 A1 | 12/2009 | Ide |
| 2010/0007358 A1 | 1/2010 | Schaerrer et al. |
| 2010/0141224 A1 | 6/2010 | Ilic et al. |
| 2010/0148847 A1 | 6/2010 | Schurack et al. |
| 2010/0284208 A1 | 11/2010 | Nguyen et al. |
| 2011/0001438 A1 | 1/2011 | Chemel et al. |
| 2011/0133651 A1 | 6/2011 | Chistyakov et al. |
| 2011/0140607 A1 | 6/2011 | Moore et al. |
| 2011/0309748 A1 | 12/2011 | Xia |
| 2012/0016282 A1 | 1/2012 | Van Brunt et al. |
| 2012/0052599 A1 | 3/2012 | Brouk et al. |
| 2012/0081350 A1 | 4/2012 | Sano et al. |
| 2012/0155613 A1 | 6/2012 | Caiafa et al. |
| 2013/0024784 A1 | 1/2013 | Lifton |
| 2013/0027848 A1 | 1/2013 | Said |
| 2013/0029492 A1 | 1/2013 | Inoue et al. |
| 2013/0075390 A1 | 3/2013 | Ashida |
| 2013/0092529 A1 | 4/2013 | Singh et al. |
| 2013/0113650 A1 | 5/2013 | Behbahani et al. |
| 2013/0146443 A1 | 6/2013 | Papa et al. |
| 2013/0174105 A1 | 7/2013 | Nishio et al. |
| 2013/0175575 A1 | 7/2013 | Ziemba et al. |
| 2013/0320953 A1 | 12/2013 | Cassel et al. |
| 2014/0009969 A1 | 1/2014 | Yuzurihara et al. |
| 2014/0021180 A1 | 1/2014 | Vogel |
| 2014/0077611 A1 | 3/2014 | Young et al. |
| 2014/0109886 A1 | 4/2014 | Singleton et al. |
| 2014/0118414 A1 | 5/2014 | Seo et al. |
| 2014/0119086 A1 | 5/2014 | Potharaju et al. |
| 2014/0146571 A1 | 5/2014 | Ryoo et al. |
| 2014/0268968 A1 | 9/2014 | Richardson |
| 2014/0349418 A1 | 11/2014 | Inoue et al. |
| 2014/0354343 A1 | 12/2014 | Ziemba et al. |
| 2015/0028932 A1 | 1/2015 | Ziemba et al. |
| 2015/0076372 A1 | 3/2015 | Ziemba et al. |
| 2015/0084509 A1 | 3/2015 | Yuzurihara et al. |
| 2015/0130525 A1 | 5/2015 | Miller et al. |
| 2015/0155086 A1 | 6/2015 | Matsuura |
| 2015/0256086 A1 | 9/2015 | Miller et al. |
| 2015/0303914 A1 | 10/2015 | Ziemba et al. |
| 2015/0311680 A1 | 10/2015 | Burrows et al. |
| 2015/0318846 A1 | 11/2015 | Prager et al. |
| 2016/0020070 A1 | 1/2016 | Kim et al. |
| 2016/0020072 A1 | 1/2016 | Brouk et al. |
| 2016/0182001 A1 | 6/2016 | Zeng et al. |
| 2016/0211153 A1 | 7/2016 | Terauchi et al. |
| 2016/0220670 A1 | 8/2016 | Kalghatgi et al. |
| 2016/0225587 A1 | 8/2016 | Inoue et al. |
| 2016/0241234 A1 | 8/2016 | Mavretic |
| 2016/0269195 A1 | 9/2016 | Coenen et al. |
| 2016/0327029 A1 | 11/2016 | Ziemba et al. |
| 2016/0327089 A1 | 11/2016 | Adam et al. |
| 2017/0083810 A1 | 3/2017 | Ielmini et al. |
| 2017/0126049 A1 | 5/2017 | Pan et al. |
| 2017/0154726 A1 | 6/2017 | Prager et al. |
| 2017/0243731 A1 | 8/2017 | Ziemba et al. |
| 2017/0294842 A1 | 10/2017 | Miller et al. |
| 2017/0311431 A1 | 10/2017 | Park |
| 2017/0359886 A1 | 12/2017 | Binderbauer et al. |
| 2017/0366173 A1 | 12/2017 | Miller et al. |
| 2018/0226896 A1 | 8/2018 | Miller et al. |
| 2018/0286636 A1 | 10/2018 | Ziemba et al. |
| 2018/0315581 A1 | 11/2018 | Hayami et al. |
| 2018/0315583 A1 | 11/2018 | Luere et al. |
| 2018/0374689 A1 | 12/2018 | Abraham et al. |
| 2019/0080884 A1 | 3/2019 | Ziemba et al. |
| 2019/0088518 A1 | 3/2019 | Koh et al. |
| 2019/0131110 A1 | 5/2019 | Ziemba et al. |
| 2019/0157044 A1 | 5/2019 | Ziemba et al. |
| 2019/0157980 A1 | 5/2019 | Ji et al. |
| 2019/0172685 A1 | 6/2019 | Van Zyl et al. |
| 2019/0180982 A1 | 6/2019 | Brouk et al. |
| 2019/0228952 A1 | 7/2019 | Dorf et al. |
| 2019/0326092 A1 | 10/2019 | Ogasawara et al. |
| 2019/0348258 A1 | 11/2019 | Koh et al. |
| 2019/0350072 A1 | 11/2019 | Dorf et al. |
| 2019/0393791 A1 | 12/2019 | Ziemba et al. |
| 2020/0035457 A1 | 1/2020 | Ziemba et al. |
| 2020/0035458 A1 | 1/2020 | Ziemba et al. |
| 2020/0043702 A1 | 2/2020 | Ziemba et al. |
| 2020/0051786 A1 | 2/2020 | Ziemba et al. |
| 2020/0154556 A1 | 5/2020 | Dorf et al. |
| 2020/0161092 A1 | 5/2020 | Inoue et al. |
| 2020/0168436 A1 | 5/2020 | Ziemba et al. |
| 2020/0352017 A1 | 11/2020 | Dorf et al. |
| 2020/0378605 A1 | 12/2020 | Lacoste |
| 2020/0396820 A1 | 12/2020 | de Vries et al. |
| 2021/0152163 A1 | 5/2021 | Miller et al. |

FOREIGN PATENT DOCUMENTS

| | | |
|---|---|---|
| CN | 103458600 B | 7/2016 |
| CN | 106537776 A | 3/2017 |
| EP | 0174164 A2 | 3/1986 |
| EP | 0947048 A1 | 10/1999 |
| EP | 1128557 A2 | 8/2001 |
| EP | 1515430 A1 | 3/2005 |
| FR | 2771563 A1 | 5/1999 |
| JP | H09129621 A | 5/1997 |
| JP | 2002359979 A | 12/2002 |
| JP | 2013135159 A | 7/2013 |
| JP | 2016134461 A | 7/2016 |
| JP | 2017501298 A | 1/2017 |
| WO | 9738479 A1 | 10/1997 |
| WO | 0193419 A1 | 12/2001 |
| WO | 2010069317 A1 | 6/2010 |
| WO | 2014036000 A1 | 3/2014 |
| WO | 2016171582 A1 | 10/2016 |
| WO | 2018186901 A1 | 10/2018 |

OTHER PUBLICATIONS

International Search Report and Written Opinion as issued in connection with International Patent Application No. PCT/US2018/016993, mailed Apr. 18, 2018, 11 pages.

(56) References Cited

OTHER PUBLICATIONS

Non-Final Office Action in U.S. Appl. No. 15/889,586 dated Sep. 12, 2018, 18 pages.
Notice of Allowance in U.S. Appl. No. 14/798,154 dated Jun. 1, 2018, 05 pages.
International Search Report and Written Opinion as issued in connection with International Patent Application No. PCT/US2018/025440, mailed Jun. 25, 2018, 25 pages.
Notice of Allowance in U.S. Appl. No. 15/623,464, dated Oct. 17, 2018, 7 pages.
International Search Report and Written Opinion as issued in connection with International Patent Application No. PCT/US2018/048206, mailed Nov. 1, 2018, 10 pages.
Non Final Office Action in U.S. Appl. No. 15/941,731, dated Nov. 16, 2018, 17 pages.
Non-Final Office Action in U.S. Appl. No. 15/921,650 dated Nov. 28, 2018, 11 pages.
Non Final Office Action in U.S. Appl. No. 16/178,538, dated Jan. 11, 2019, 27 pages.
Non Final Office Action in U.S. Appl. No. 16/250,765, dated Mar. 29, 2019, 11 pages.
Notice of Allowance in U.S. Appl. No. 16/114,195, dated Apr. 3, 2019, 9 pages.
Notice of Allowance in U.S. Appl. No. 15/921,650 dated Apr. 4, 2019, 7 pages.
Non Final Office Action in U.S. Appl. No. 16/178,565, dated Apr. 4, 2019, 10 pages.
Final Office Action in U.S. Appl. No. 15/889,586 dated May 2, 2019, 19 pages.
Final Office Action in U.S. Appl. No. 15/941,731, dated May 3, 2019, 16 pages.
Final Office Action in U.S. Appl. No. 16/178,538 dated Jun. 7, 2019, 17 pages.
Notice of Allowance in U.S. Appl. No. 16/250,765, dated Jul. 10, 2019, 9 pages.
Final Office Action in U.S. Appl. No. 16/178,565, dated Jul. 12, 2019, 11 pages.
Notice of Allowance in U.S. Appl. No. 16/178,538 dated Jul. 17, 2019, 10 pages.
Non-Final Office Action in U.S. Appl. No. 15/889,586 dated Sep. 6, 2019, 17 pages.
International Preliminary Report on Patentability in connection with International Patent Application No. PCT/US2018/025440, mailed Oct. 1, 2019, 10 pages.
International Search Report and Written Opinion as issued in connection with International Patent Application No. PCT/US2019/043933, mailed Oct. 25, 2019, 9 pages.
Notice of Allowance in U.S. Appl. No. 16/178,565, dated Nov. 14, 2019, 5 pages.
Non Final Office Action in U.S. Appl. No. 15/945,722, dated Nov. 15, 2019, 13 pages.
International Search Report and Written Opinion as issued in connection with International Patent Application No. PCT/US2019/043932, mailed Dec. 5, 2019, 16 pages.
International Search Report and Written Opinion as issued in connection with International Patent Application No. PCT/US2019/043988, mailed Dec. 10, 2019, 13 pages.
Non Final Office Action in U.S. Appl. No. 16/250,157 dated Dec. 19, 2019, 6 pages.
International Search Report and Written Opinion as issued in connection with International Patent Application No. PCT/US2019/046067, mailed Jan. 3, 2020, 13 pages.
Notice of Allowance in U.S. Appl. No. 16/525,357, dated Jan. 14, 2020, 8 pages.
Non-Final Office Action in U.S. Appl. No. 16/599,318, dated Jan. 16, 2020, 11 pages.
Non-Final Office Action in U.S. Appl. No. 16/722,085, dated Mar. 6, 2020, 5 pages.
Final Office Action in U.S. Appl. No. 15/889,586 dated Mar. 18, 2020, 18 pages.
Non-Final Office Action in U.S. Appl. No. 16/523,840, dated Mar. 19, 2020, 6 pages.
Notice of Allowance in U.S. Appl. No. 15/945,722, dated Apr. 3, 2020, 7 pages.
Non-Final Office Action in U.S. Appl. No. 16/736,971, dated Apr. 7, 2020, 14 pages.
Notice of Allowance in U.S. Appl. No. 16/250,157 dated Apr. 13, 2020, 8 pages.
Non-Final Office Action in U.S. Appl. No. 16/457,791 dated Apr. 15, 2020, 12 pages.
Final Office Action in U.S. Appl. No. 16/736,971, dated Apr. 17, 2020, 6 pages.
International Search Report and Written Opinion as issued in connection with International Patent Application No. PCT/US2020/016253, mailed Apr. 29, 2020, 7 pages.
Advisory Action in U.S. Appl. No. 16/736,971, dated May 12, 2020, 5 pages.
Non-Final Office Action in U.S. Appl. No. 16/722,115, dated May 14, 2020, 6 pages.
Non-Final Office Action in U.S. Appl. No. 16/555,948, dated May 15, 2020, 8 pages.
International Search Report and Written Opinion as issued in connection with International Patent Application No. PCT/US2020/012641, mailed May 28, 2020, 15 pages.
Extended European Search Report for Application No. 18848041.2 received Jun. 23, 2020, 9 pages.
Final Office Action in U.S. Appl. No. 16/523,840, dated Jun. 26, 2020, 5 pages.
Notice of Allowance in U.S. Appl. No. 16/736,971, dated Jun. 30, 2020, 14 pages.
Advisory Action in U.S. Appl. No. 15/889,586 dated Jul. 10, 2020, 4 pages.
Notice of Allowance in U.S. Appl. No. 16/722,085, dated Jul. 16, 2020, 8 pages.
Final Office Action in U.S. Appl. No. 16/599,318, dated Jul. 23, 2020, 14 pages.
Notice of Allowance in U.S. Appl. No. 16/599,318, dated Aug. 4, 2020, 8 pages.
Non Final Office Action in U.S. Appl. No. 16/537,513, dated Sep. 3, 2020, 13 pages.
Non-Final Office Action in U.S. Appl. No. 15/889,586 dated Sep. 18, 2020, 19 pages.
International Search Report and Written Opinion as issued in connection with International Patent Application No. PCT/US2020/040579, mailed Sep. 30, 2020, 10 pages.
Notice of Allowance in U.S. Appl. No. 16/523,840, dated Sep. 30, 2020, 11 pages.
International Search Report and Written Opinion as issued in connection with International Patent Application No. PCT/US2020/034427, mailed Oct. 16, 2020, 9 pages.
Non Final Office Action in U.S. Appl. No. 16/903,374, dated Nov. 25, 2020, 16 pages.
Final Office Action in U.S. Appl. No. 16/722,115, dated Dec. 2, 2020, 7 pages.
Notice of Allowance in U.S. Appl. No. 16/523,840, dated Dec. 4, 2020, 11 pages.
Notice of Allowance in U.S. Appl. No. 16/555,948, dated Jan. 13, 2021, 7 pages.
Notice of Allowance in U.S. Appl. No. 16/457,791 dated Jan. 22, 2021, 7 pages.
International Search Report and written opinion received for PCT Patent Application No. PCT/US2020/60799, mailed in Feb. 5, 2021, 11 pages.
Notice of Allowance in U.S. Appl. No. 16/848,830, dated Feb. 19, 2021, 8 pages.
Extended European Search Report for Application No. 20195265.2 received Mar. 17, 2021, 8 pages.
Notice of Allowance in U.S. Appl. No. 16/722,115, dated Apr. 1, 2021, 9 pages.
Notice of Allowance in U.S. Appl. No. 15/889,586 dated Apr. 14, 2021, 9 pages.
Non Final Office Action in U.S. Appl. No. 16/941,532, dated Apr. 14, 2021, 10 pages.

(56) References Cited

OTHER PUBLICATIONS

Extended European Search Report for Application No. 20200919.7 received Apr. 30, 2021, 11 pages.
Non-Final Office Action in U.S. Appl. No. 16/722,115, dated May 3, 2021, 9 pages.
Notice of Allowance in U.S. Appl. No. 16/848,830, dated May 13, 2021, 6 pages.
Non-Final Office Action in U.S. Appl. No. 15/889,586 dated Jun. 11, 2021, 11 pages.
International Preliminary Report on Patentability in connection with International Patent Application No. PCT/US2020/012641, mailed Jun. 16, 2021, 11 pages.
Non-Final Office Action in U.S. Appl. No. 16/941,532 dated Jul. 16, 2021, 10 pages.
Notice of Allowance in U.S. Appl. No. 16/903,374, dated Jul. 19, 2021, 8 pages.
Non-Final Office Action in U.S. Appl. No. 17/223,004, dated Aug. 31, 2021, 12 pages.
Non-Final Office Action in U.S. Appl. No. 17/033,662 dated Sep. 1, 2021, 17 pages.
Notice of Allowance in U.S. Appl. No. 16/737,615 dated Nov. 24, 2021, 11 pages.
Final Office Action in U.S. Appl. No. 17/033,662 dated Dec. 8, 2021, 17 pages.
Non-Final Office Action in U.S. Appl. No. 17/213,230 dated Dec. 14, 2021, 6 pages.
English translation of Office Action for Taiwan application No. 109100609 mailed Dec. 16, 2021, 5 pages.
Notification of Reason for Refusal in JP Patent application No. 2021-101259 dated Feb. 1, 2022, 21 pages.
Non-Final Office Action in U.S. Appl. No. 17/163,331 dated Mar. 4, 2022, 23 pages.
Notice of Allowance in U.S. Appl. No. 16/941,532, dated Apr. 5, 2022, 9 pages.
Final Office Action in U.S. Appl. No. 17/223,004 dated May 11, 2022, 9 pages.
Final Office Action in U.S. Appl. No. 17/213,230 dated May 16, 2022, 16 pages.
Non-Final Office Action in U.S. Appl. No. 17/499,863 dated Jun. 7, 2022, 15 pages.
Notice of Allowance in U.S. Appl. No. 17/223,004 dated Jul. 25, 2022, 8 pages.
Advisory Action in U.S. Appl. No. 17/213,230 dated Aug. 5, 2022, 3 pages.
Non-Final Office Action in U.S. Appl. No. 17/213,230 dated Sep. 15, 2022, 9 pages.
Notice of Allowance in U.S. Appl. No. 17/499,863 dated Oct. 19, 2022, 7 pages.
Notice of Allowance in U.S. Appl. No. 17/098,207 dated Jan. 5, 2023, 15 pages.
Notice of Allowance in U.S. Appl. No. 17/033,662, dated Feb. 7, 2023, 9 pages.
Notice of Allowance in U.S. Appl. No. 17/834,933 mailed on Feb. 16, 2023, 9 pages.
Non-Final Office Action in U.S. Appl. No. 17/411,028 dated Feb. 24, 2023, 6 pages.
Notice of Allowance in U.S. Appl. No. 17/213,230 dated Mar. 8, 2023, 7 pages.
Final Office Action in U.S. Appl. No. 17/411,028 dated Jun. 22, 2023, 9 pages.
Notice of Allowance in U.S. Appl. No. 17/411,028 dated Aug. 30, 2023, 9 pages.
Non-Final Office Action in U.S. Appl. No. 18/340,841 dated Jan. 24, 2023, 18 pages.
Notice of Allowance in U.S. Appl. No. 15/941,731, dated Jul. 17, 2019, 12 pages.
Extended European Search Report for Application No. 23158873.2 received Jun. 9, 2023, 9 pages.
Final Office Action in U.S. Appl. No. 18/340,841 dated Jun. 25, 2024, 12 pages.

Bland, M.J., et al., "A High Power RF Power Supply for High Energy Physics Applications," Proceedings of 2005 the Particle Accelerator Conference, IEEE pp. 4018-4020 (May 16-20, 2005).
Dammertz, G., et al., "Development of Multimegawatt Gyrotrons for Fusion Plasma Heating and current Drive," IEEE Transactions on Electron Devices, vol. 52, No. 5, pp. 808-817 (Apr. 2005) (Abstract).
Garwin, R., "Pulsed Power Peer Review Committee Report," Sandia National Laboratories Report, SAND2000-2515, pp. 3-38 (Oct. 2000).
Gaudet, J.A., et al., "Research issues in Developing Compact Pulsed Power for High Peak Power Applications on Mobile Platforms," Proceedings of the IEEE, vol. 92, No. 7, pp. 1144-1165 (Jul. 2004).
Goodman, E. A., "Characteristics of sheet windings in transformers", IEEE Engineering, vol. 82, No. 11, pp. 673-676 (Nov. 1963) (Abstract).
In, Y., et al., "On the roles of direct feedback and error field correction in stabilizing resistive-wall modes," Nuclear 2 Fusion, vol. 50, No. 4, pp. 1-5 (2010).
Kim, J.H., et al., "High Voltage Pulsed Power Supply Using IGBT Stacks," IEEE Transactions on Dielectrics and Electrical insulation, vol. 14, No. 4, pp. 921-926 (Aug. 2007).
Locher, R., "Introduction to Power MOSFETs and their Applications (Application Note 558)," Fairchild Semiconductor, 15 pages (Oct. 1998).
Locher, R.E., and Pathak, A.D., "Use of BiMOSFETs in Modern Radar Transmitters," IEEE International Conference on Power Electronics and Drive Systems, pp. 776-782 (2001).
Pokryvailo, A., et al., "A 1KW Pulsed Corona System for Pollution Control Applications," 14th IEEE International Pulsed Power Conference, Dallas, TX, USA (Jun. 15-18, 2003).
Pokryvailo, A., et al., "High-Power Pulsed Corona for Treatment of Pollutants in Heterogeneous Media," IEEE Transactions on Plasma Science, vol. 34, No. 5, pp. 1731-1743 (Oct. 2006) (Abstract).
Prager, J.R. et al., "A High Voltage Nanosecond Pulser with Variable Pulse Width and Pulse Repetition Frequency control For Nonequilibrium Plasma Applications", 41st International Conference on Plasma Sciences held with 2014 IEEE International Conference on High-Power Particle Beams, May 25-29, 2014, 6, Washington, D.C.
Pustylnik, M., et al., "High-voltage nanosecond pulses in a low-pressure radiofrequency discharge", Physical Review E, vol. 87, No. 6, pp. 1-9 (2013).
Quinley, M., et al., "High Voltage Nanosecond Pulser Operating at 30 kW and 400 kHz" APS-GEC-2018, 1 page (2018).
Rao, X., et al., "Combustion Dynamics of Plasma-Enhanced Premixed and Nonpremixed Flames," IEEE Transactions on Plasma Science, vol. 38, No. 12, pp. 3265-3271 (Dec. 2010).
Reass, W.A., et al., "Progress Towards a 20 KV, 2 KA Plasma Source Ion Implantation Modulator for Automotive Production of Diamond Film on Aluminum," Submitted to 22nd International Power Symposium, Boca Raton, FL, 6 pages (Jun. 24-27, 1996).
Sanders, J.M., et al., "Scalable, compact, nanosecond pulse generator with a high repetition rate for biomedical applications requiring intense electric fields," 2009 IEEE Pulsed Power Conference, Washington, DC, 2 pages (Jun. 28, 2009-Jul. 2, 2009) (Abstract).
Schamiloglu, E., et al., "Scanning the Technology: Modem Pulsed Power: Charlie Martin and Beyond," Proceedings of the IEEE, vol. 92, No. 7, pp. 1014-1020 (Jul. 2004).
Scoville, J.T., et al., "The Resistive Wall Mode Feedback Control System on DIII-D," IEEE/NPSS 18th Symposium on fusion Engineering, Albuquerque, NM, Oct. 25-29, 1999, General Atomics Report GAA23256, 7 pages (Nov. 1999).
Singleton, D.R., et al., "Compact Pulsed-Power System for Transient Plasma Ignition," IEEE Transactions on Plasma Science, vol. 37, No. 12, pp. 2275-2279 (2009) (Abstract).
Singleton, D.R., et al., "Low Energy Compact Power Modulators for Transient Plasma Ignition," IEEE Transactions on Dielectrics and Electrical Insulation, vol. 18, No. 4, pp. 1084-1090 (Aug. 2011) (Abstract).
Starikovskiy, A., and Aleksandrov, N., "Plasma-assisted ignition and combustion," Progress in Energy and Combustion Science, vol. 39, No. 1, pp. 61-110 (Feb. 2013).

(56) References Cited

OTHER PUBLICATIONS

Wang, F., et al., "Compact High Repetition Rate Pseudospark Pulse Generator," IEEE Transactions on Plasma Science, vol. 33, No. 4, pp. 1177-1181 (Aug. 2005) (Abstract).
Zavadtsev, D.A., et al., "Compact Electron Linear Accelerator RELUS-5 for Radiation Technology Application," 10th European Particle Accelerator Conference, Edinburgh, UK, pp. 2385-2387 (Jun. 26-30, 2006).
Zhu, Z., et al., "High Voltage pulser with a fast fall-time for plasma immersion ion implantation," Review of Scientific Instruments, vol. 82, No. 4, pp. 045102-1-045102-4 (Apr. 2011).
International Search Report and Written Opinion as issued in connection with International Patent Application No. PCT/US2014/040929, mailed Sep. 15, 2014, 10 pages.
International Search Report and Written Opinion as issued in connection with International Patent Application No. PCT/US2014/065832, mailed Feb. 20, 2015, 13 pages.
Invitation to pay additional fees in PCT Application No. PCT/US2015/018349 mailed on May 15, 2015, 2 pages.
International Search Report and Written Opinion as issued in connection with International Patent Application No. PCT/US2015/018349, mailed Jul. 14, 2015, 15 pages.
International Search Report and Written Opinion as issued in connection with International Patent Application No. PCT/US2015/040204, mailed Oct. 6, 2015, 12 pages.
Non-Final Office Action in U.S. Appl. No. 14/542,487 dated Nov. 23, 2015, 11 pages.
Non-Final Office Action in U.S. Appl. No. 14/798,154 dated Jan. 5, 2016, 13 pages.
Final Office Action in U.S. Appl. No. 14/542,487 dated Feb. 12, 2016, 11 pages.
Non-Final Office Action in U.S. Appl. No. 14/542,487 dated Apr. 8, 2016, 12 pages.
International Preliminary Report on Patentability in PCT Application No. PCT/US2014/065832 mailed on May 17, 2016, 7 pages.
Non Final Office Action in U.S. Appl. No. 14/635,991, dated Jul. 29, 2016, 17 pages.
International Preliminary Report on Patentability in PCT Application No. PCT/US2015/018349 mailed on Sep. 6, 2016, 8 pages.
Final Office Action in U.S. Appl. No. 14/798,154 dated Oct. 6, 2016, 14 pages.
Final Office Action in U.S. Appl. No. 14/542,487 dated Dec. 12, 2016, 13 pages.
International Preliminary Report on Patentability in PCT Application No. PCT/US2015/040204 mailed on Jan. 17, 2017, 7 pages.
Final Office Action in U.S. Appl. No. 14/635,991, dated Jan. 23, 2017, 22 pages.
Advisory Action in U.S. Appl. No. 14/542,487 dated Mar. 28, 2017, 03 pages.
Notice of Allowance in U.S. Appl. No. 14/635,991, dated May 4, 2017, 07 pages.
Non-Final Office Action in U.S. Appl. No. 14/798,154 dated May 26, 2017, 16 pages.
Non-Final Office Action in U.S. Appl. No. 14/542,487 dated Jun. 5, 2017, 12 pages.
Partial Supplementary European Search Report received Jul. 28, 2017 in related foreign application No. 14861818.4, 12 Pages.
Non Final Office Action in U.S. Appl. No. 15/623,464, dated Nov. 7, 2017, 18 pages.
Final Office Action in U.S. Appl. No. 14/542,487 dated Dec. 19, 2017, 07 pages.
Final Office Action in U.S. Appl. No. 14/798,154 dated Dec. 28, 2017, 06 pages.
Notice of Allowance in U.S. Appl. No. 14/542,487 dated Mar. 21, 2018, 05 pages.

\* cited by examiner

APPARATUS AND METHOD OF GENERATING A WAVEFORM

BACKGROUND

Producing high voltage pulses with fast rise times and/or fast fall times is challenging. For instance, to achieve a fast rise time and/or a fast fall time (e.g., less than about 50 ns) for a high voltage pulse (e.g., greater than about 5 kV), the slope of the pulse rise and/or fall must be incredibly steep (e.g., greater than $10^{11}$ V/s). Such steep rise times and/or fall times are very difficult to produce especially in circuits driving a load with high capacitance. Such pulses may be especially difficult to produce using standard electrical components; and/or with pulses having variable pulse widths, voltages, and repetition rates; and/or within applications having capacitive loads such as, for example, a plasma.

SUMMARY

Some embodiments may include a high voltage waveform generator comprising: a generator inductor; a high voltage nanosecond pulser electrically and/or inductively coupled with the generator inductor, the high voltage nanosecond pulser configured to charge the generator inductor with: a first pulse burst comprising a first plurality of high voltage pulses, each pulse of the first plurality of pulses having a pulse width, the first pulse burst having a first burst period; and a second pulse burst comprising a second plurality of high voltage pulses, each pulse of the second plurality of pulses having a pulse width, the second pulse burst having a second burst period; and a plasma electrically coupled with the nanosecond pulser and the generator inductor, the voltage across the plasma varying according to: a first plasma pulse having a first output pulse width and a first output voltage, the first output pulse width being substantially equal to the first burst period and the first output voltage being substantially proportional to a pulse width of each of the pulses of the first plurality of pulses, and a second plasma pulse having a second output pulse width and a second output voltage, the second output pulse width being substantially equal to the second burst period and the second output voltage being substantially proportional to a pulse width of each of the pulses of the second plurality of pulses.

In some embodiments, either or both the first pulse burst and the second pulse burst has an amplitude greater than 500 V. In some embodiments, either or both the first plasma pulse and the second plasma pulse has an amplitude greater than 500 V.

In some embodiments, the second pulse burst has an amplitude that is different than the amplitude of the first pulse burst. In some embodiments, wherein the amplitude of one or more of the first plurality of high voltage pulses is different than amplitude of one or more of the other first plurality of high voltage pulses. In some embodiments, wherein the voltage of the first plasma pulse is different than the voltage of the second plasma pulse.

In some embodiments, the high voltage waveform generator may include a pulldown resistor electrically and/or inductively coupled with the generator inductor and the high voltage nanosecond pulser. In some embodiments, the high voltage waveform generator may include a transformer.

In some embodiments, the first burst period and/or the second burst period is less than about 50 ms. In some embodiments, either or both the first plasma pulse and the second plasma pulse establish a potential within the plasma.

In some embodiments, either or both the first plasma pulse and the second plasma pulse accelerate ions within the plasma. In some embodiments, either or both the first plurality of pulses and/or the second plurality of pulses have a frequency greater than about 50 kHz. In some embodiments, at least one pulse of the first plurality of pulses has a pulse width and/or at least one pulse of the second plurality of pulses has a pulse width less than 500 ns.

In some embodiments, the generator inductor comprises stray inductance. In some embodiments, the generator inductor has an inductance less than about 20 µH. In some embodiments, the peak output power is greater than 10 kW. In some embodiments, the plasma is substantially capacitive in nature.

Some embodiments may include a high voltage waveform generator comprising: a generator inductor; a generator capacitor electrically and/or inductively coupled with the generator inductor; a high voltage nanosecond pulser electrically or inductively coupled with the generator inductor and the generator capacitor, the high voltage nanosecond pulser configured to charge the generator inductor with a first pulse burst and a second pulse burst; and a load electrically and/or inductively coupled with the nanosecond pulser, the generator inductor, and the generator capacitor, the voltage across the load varying according to: a first load pulse and/or a second load pulse. In some embodiments, the first pulse burst comprises a plurality of high voltage pulses, each pulse of the plurality of pulses having a first pulse width and a voltage greater than 500 V, the first pulse burst having a first burst period; and/or the second pulse burst may comprise a plurality of high voltage pulses, each pulse of the plurality of pulses having a second pulse width and a voltage greater than 500 V, the second pulse burst having a second burst period. In some embodiments, the first load pulse may have a first output pulse width and a first output voltage, the first output pulse width being substantially equal to the first burst period and the first output voltage being proportional to the first pulse width, and the second load pulse may have a second output pulse width and a second output voltage, the second output pulse width being substantially equal to the second burst period and the second output voltage being proportional to the second pulse width.

In some embodiments, the first pulse output voltage is greater than 500 V, and the second pulse output voltage is greater than 500 V. In some embodiments, the first pulse output voltage is greater than the second pulse output voltage. In some embodiments, the load comprises a plasma.

In some embodiments, the high voltage waveform generator may include a pulldown resistor electrically and/or inductively coupled with the generator inductor and the high voltage nanosecond pulser. In some embodiments, the high voltage waveform generator may include a transformer. In some embodiments, the first burst period is less than about 1 microsecond, the first pulse width is less than about 200 nanoseconds, and the second pulse width is less than about 200 nanoseconds.

Some embodiments of the invention include a method for generating high voltage waveforms. In some embodiments, the method may include generating a first pulse burst comprising a plurality of high voltage pulses, each pulse of the plurality of pulses having a first pulse width and a voltage greater than 500 V, the first pulse burst having a first burst period; charging a generator inductor with the first pulse burst; outputting a first output pulse having a first output pulse width and a first output voltage, the first output pulse width being substantially equal to the first burst period and the first output voltage being proportional to the first pulse width; generating a second pulse burst comprising a plurality of high voltage pulses, each pulse of the plurality of pulses having a second pulse width and a voltage greater than 500 V, the second pulse burst having a second burst period; charging a generator inductor with the second pulse burst; and outputting a second output pulse having a first output pulse width and a second output voltage, the second output pulse width being substantially equal to the second burst period and the second output voltage being proportional to the second pulse width.

In some embodiments, the first pulse output voltage is greater than 500 V, and the second pulse output voltage is greater than 500 V. In some embodiments, the first pulse output voltage is greater than the second pulse output voltage. In some embodiments, the first output pulse and the second output pulse is provided to a plasma. In some embodiments, the first burst period is less than about 10 ms, the second burst period is less than about 10 ms, the first pulse width is less than 200 nanoseconds, and the second pulse width is less than 200 nanoseconds.

Some embodiments of the invention may include a high voltage waveform generator comprising: a generator inductor; a generator capacitor electrically and/or inductively coupled with the generator inductor; a high voltage nanosecond pulser electrically and/or inductively coupled with the generator inductor and the generator capacitor, the high voltage nanosecond pulser configured to charge the generator inductor with a first pulse burst and/or a second pulse burst; and a load electrically and/or inductively coupled with the nanosecond pulser, the generator inductor, and the generator capacitor, the voltage across the load varying according to a first load pulse and a second load pulse.

In some embodiments, the first pulse burst may comprise a plurality of high voltage pulses having a first voltage, each pulse of the plurality of pulses having a first pulse width and a voltage greater than 500 V, the first pulse burst having a first burst period. In some embodiments, the second pulse burst may comprise a plurality of high voltage pulses having a second voltage, each pulse of the plurality of pulses having a second pulse width and a voltage greater than 500 V, the second pulse burst having a second burst period.

In some embodiments the first load pulse may have a first output pulse width and a first output voltage, the first output pulse width being substantially equal to the first burst period and the first output voltage being a function of the first pulse width and/or the first voltage. In some embodiments, the second load pulse may have a second output pulse width and a second output voltage, the second output pulse width being substantially equal to the second burst period and the second output voltage being a function of the second pulse width and/or the second voltage.

In some embodiments, the load comprises a plasma. In some embodiments, the first burst period is less than about 10 ms, the second burst period is less than about 10 ms, the first pulse width is less than 200 nanoseconds, and the second pulse width is less than 200 nanoseconds.

Some embodiments of the invention include a high voltage waveform generator comprising a generator inductor; a generator capacitor electrically and/or inductively coupled with the generator inductor; a high voltage nanosecond pulser having one or more solid state switches electrically and/or inductively coupled with the generator inductor and the generator capacitor, the high voltage nanosecond pulser configured to produce a pulse burst having a burst period, the pulse burst comprising a plurality of pulses having different pulse widths; and a load electrically and/or inductively coupled with the high voltage nanosecond pulser, the generator inductor, and the generator capacitor, the voltage across the load having an output pulse with a pulse width substantially equal to the burst period and the voltage across the load varying in a manner that is substantially proportional with the pulse widths of the plurality of pulses.

In some embodiments, the load comprises a plasma. In some embodiments, at least a subset of the plurality of pulses have pulse widths with increasingly larger widths and the absolute value of the voltage across the load increases. In some embodiments, the pulse burst has an amplitude greater than about 500 V.

BRIEF DESCRIPTION OF THE FIGURES

These and other features, aspects, and advantages of the present disclosure are better understood when the following Disclosure is read with reference to the accompanying drawings.

DETAILED DESCRIPTION

Systems and methods are disclosed to generate high voltage waveforms with arbitrary pulse widths, voltages, and/or shapes. In some embodiments, a high voltage waveform generator may include a pulser (e.g., a nanosecond pulser) and a generator circuit. For example, a nanosecond pulser may produce a burst of high voltage pulses having a burst period $T_{br}$ and each pulse of the burst of pulses having a pulse width $T_p$. The generator circuit may produce an output pulse from the input burst of high voltage pulses. The output pulse, for example, may have a pulse width approximately the same as the burst period $T_{br}$. The output pulse, for example, may have a voltage that is a function of (e.g., proportional to) the pulse width $T_p$ of each pulse of the burst of pulses. The output pulse, for example, may have a voltage that is a function of (e.g., proportional to) the voltage $V_p$ of the input pulses, or the frequency of the input pulses, $f_p$.

In some embodiments, the peak power of the output pulses may be greater than about 1 kW, 10 kW, 100 kW, 1,000 kW, 10,000 kW, etc.

In some embodiments, the pulser may produce a burst train. Each burst train, for example, may include a plurality of bursts and each of the plurality of bursts may include a plurality of pulses. Each burst of the plurality of bursts (e.g., N bursts) may have a burst period (e.g., $T_{br1}$, $T_{br2}$, $T_{br3}$, . . . $T_{brN}$). The resulting output of the high voltage waveform generator may include a plurality of pulse widths (e.g., $PW_{br1}$, $PW_{br2}$, $PW_{br3}$, . . . $PW_{brN}$) proportional (e.g., roughly equal) to each burst period. In some embodiments, the burst periods may vary resulting in variable output pulse widths. In some embodiments, the output voltage amplitude may be proportional to the pulse width of each pulse within a burst. The voltage of each output pulse may also be proportional to the voltage and frequency of the input pulse burst.

Figure 1:
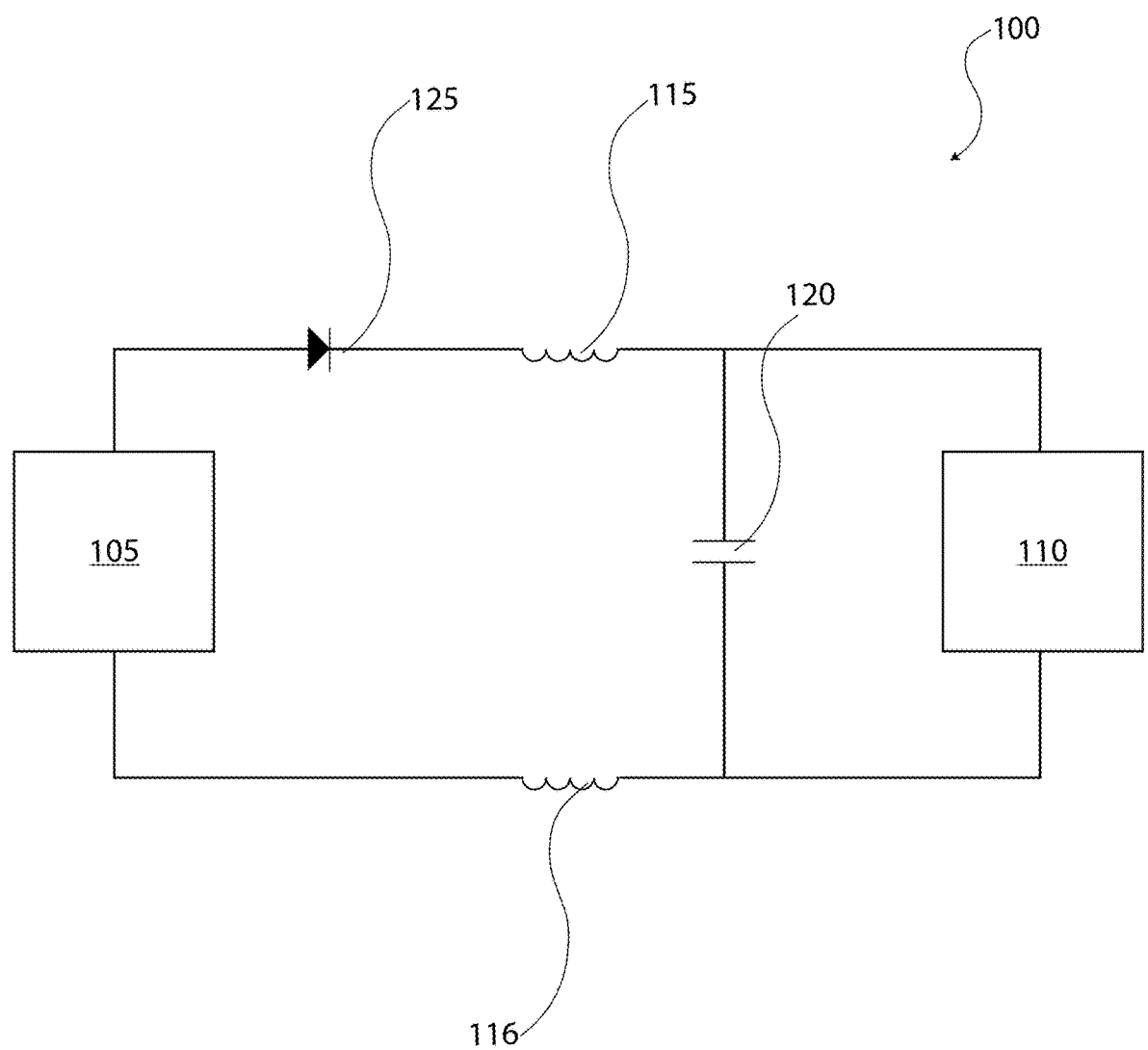
FIG. 1 is a block diagram of an example high voltage waveform generator according to some embodiments.

FIG. 1 is a block diagram of an example high voltage waveform generator 100 according to some embodiments. The high voltage waveform generator 100 may include a nanosecond pulser 105 and a load 110. The nanosecond pulser 105 may be electrically and/or inductively coupled with the load 110 via the diode 125, a generator inductor 115, and/or a generator capacitor 120. An additional inductor 116 may also be included. The shape of the waveform across the load 110 may be set by the pulse width of the nanosecond pulser 105 and/or the pulse frequency (or burst period) of the nanosecond pulser 105, and/or the pulse voltage of the nanosecond pulser 105.

In some embodiments, the additional inductor 116 may not be included. In some embodiments, the additional inductor 116 and the generator inductor 115 may not be included.

The nanosecond pulser 105, for example, may include any device capable of producing pulses greater than 500 V, peak current greater than 10 Amps, and/or pulse widths of less than about 10,000 ns, 1,000 ns, 100 ns, 10 ns, etc. As another example, the nanosecond pulser 105 may produce pulses with an amplitude greater than 1 kV, 5 kV, 10 kV, 50 kV, 200 kV, etc. As another example, the nanosecond pulser 105 may also produces pulse with rise times less than about 5 ns, 50 ns, or 300 ns, etc.

The nanosecond pulser 105 may, for example, include any pulser described in U.S. patent application Ser. No. 14/542,487, titled "HIGH VOLTAGE NANOSECOND PULSER", which is incorporated into this disclosure in its entirety for all purposes.

The nanosecond pulser 105 may, for example, include any pulser described in U.S. Pat. No. 9,601,283, titled "EFFICIENT IGBT SWITCHING", which is incorporated into this disclosure in its entirety for all purposes.

The nanosecond pulser 105 may, for example, include any pulser described in U.S. patent application Ser. No. 15/365,094, titled "HIGH VOLTAGE TRANSFORMER", which is incorporated into this disclosure in its entirety for all purposes.

The nanosecond pulser 105 may, for example, include a high voltage switch. For example, the nanosecond pulser 105 may, for example, include any switch described in U.S. Patent Application Ser. No. 62/717,637, filed Aug. 10, 2018, titled "HIGH VOLTAGE SWITCH WITH ISOLATED POWER", which is incorporated into this disclosure in its entirety for all purposes.

In some embodiments, the nanosecond pulser 105 may include one or more solid state switches such as, for example, an IGBT, a MOSFET, a SiC MOSFET, SiC junction transistor, FETs, SiC switches, GaN switches, photoconductive switch, etc.

In some embodiments, the generator inductor 115, for example, may include any inductor having an inductance less than about 3 µH. In some embodiments, the generator inductor 115 may represent stray inductance within the circuit such as, for example, within leads from the nanosecond pulser to other components in the circuit, or other circuit components. In some embodiments, the generator inductor 115 may have an inductance less than 1 µH, 0.1 µH, and 10 nH, 1 µH, 10 µH, 50 µH, etc.

In some embodiments, the additional inductor 116, for example, may include any inductor having an inductance less than about 3 µH. In some embodiments, the additional inductor 116 may represent stray inductance within the circuit such as, for example, within leads from the nanosecond pulser to other components in the circuit, or other circuit components. In some embodiments, the additional inductor 116 may have an inductance less than 1 µH, 0.1 µH, 10 nH, 1 µH, 10 µH, 50 µH, etc.

The generator capacitor 120, for example, may include any capacitor having a capacitance less than about 1 µF. For example, the generator capacitor 120 may have a capacitance be less than 1 µF, 10 µF, 100 nF, 100 pF, etc. The generator capacitor 120 may represent stray capacitance within the circuit such as, for example, within the leads, or between other generator circuit components, or it may represent capacitance contained within the load 110.

In this example, when the nanosecond pulser 105 is turned on and produces a high voltage pulse (e.g., a pulse greater than about 500 V, 5 kV, 10 kV, 15 kV, etc.), energy from the pulse is injected into the generator inductor 115. The energy from the generator inductor 115 can then charge the generator capacitor 120. When the nanosecond pulser 105 is turned off, the energy in the generator inductor 115 can continue to charge the generator capacitor 120. If the pulse width of the high voltage pulse is long enough to completely charge the generator capacitor 120, the voltage across the generator capacitor 120 can be twice the voltage of the high voltage pulse. By varying the pulse width, the frequency, and/or the voltage of the high voltage pulses, the voltage across the generator capacitor 120 can be varied. For example, the voltage across the generator capacitor 120 may be proportional to the pulse width, frequency, and/or voltage of the high voltage pulse from the nanosecond pulser 105 as shown by the waveforms shown in FIGS. 8A, 8B, 8C, and 8D.

In some embodiments, the phrase "charge the inductor" can be used to describe energy is passed through the inductor and/or energy is stored within the inductor.

In some embodiments, generator inductor 115 may not be used to regulate how much energy charges the generator capacitor 120. Some energy from the nanosecond pulser 105 may end up in the generator inductor 115, however, much of the energy will just pass through the generator inductor 115 into the generator capacitor 120. Thus, in some embodiments, the generator inductor 115 and/or the additional inductor 116 may not be included.

Figure 2:
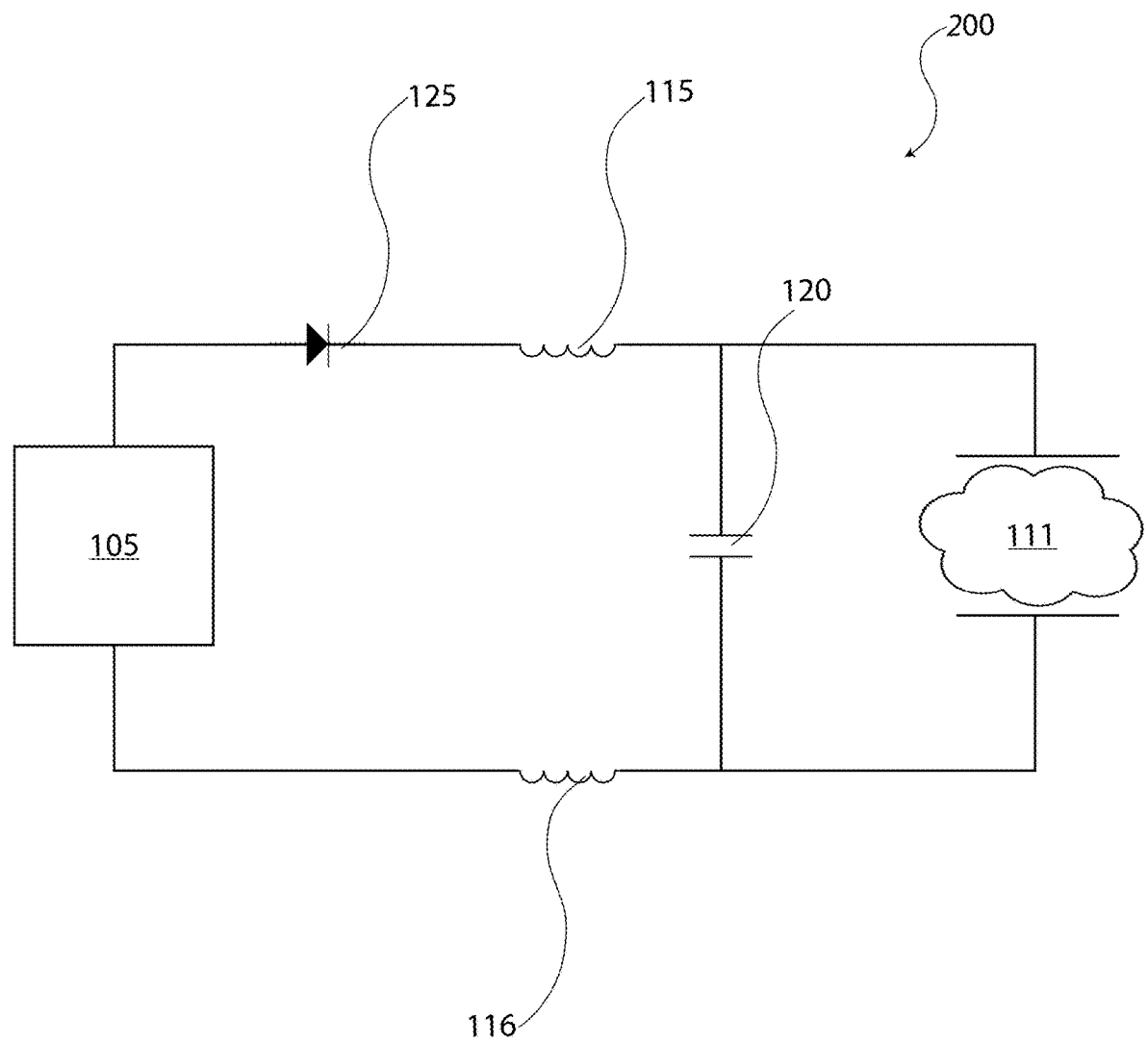
FIG. 2 is a block diagram of an example high voltage waveform generator according to some embodiments.

FIG. 2 is a block diagram of an example high voltage waveform generator 200 according to some embodiments. In this example, the load is a plasma 111. The inductors 115 and/or 116 may not be present, or may consist of just the stray circuit inductance. The capacitance 120 may be part of the plasma's capacitance. The plasma may have a number of unique characteristics, such as, for example, a capacitance, an electron mobility, and an ion mobility that differs from the electron mobility. In this example, output pulses of variable voltages may be applied to the plasma 111. The plasma 111 may include any type of plasma that may include charged ions and/or charged radicals. In some embodiments, the plasma may be used in a semiconductor fabrication process. In some applications, the output pulse amplitude may be used to control the energy of the plasma ions. In some applications, the ions may be used to etch various materials. These materials may include wafers used in the manµFacture of semiconductors. In some embodiments, the high voltage waveform generator 200 can be used to control the voltage applied across a plasma 111 or a plasma sheath.

Figure 3A:
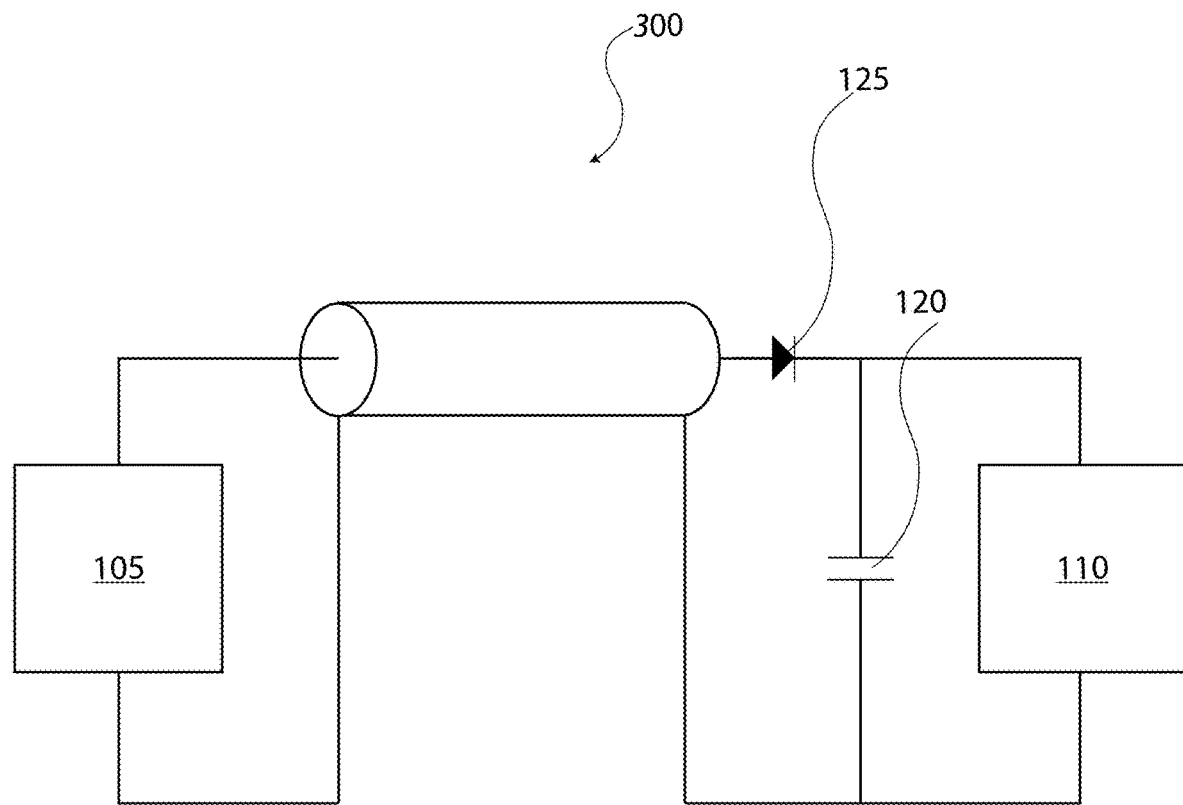
FIGS. 3A and 3B are block diagrams of example high voltage waveform generators according to some embodiments.

FIG. 3A is a block diagram of an example high voltage waveform generator 300 according to some embodiments. In this example, the high voltage waveform generator 300 may include a driving cable 124 such as, for example, a coax cable or a twin lead cable.

Figure 3B:
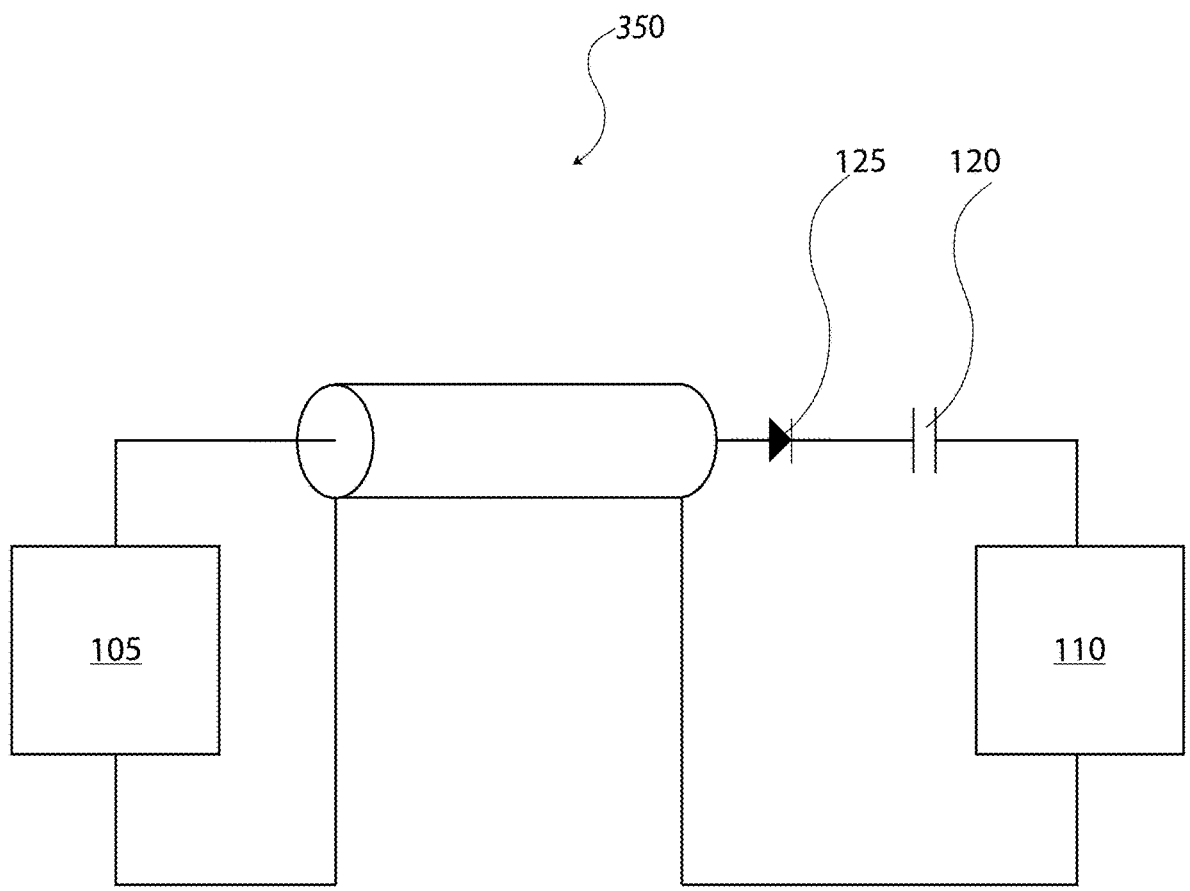

In some embodiments, the generator capacitor 120, for example, may be in series with the load 110 as shown by circuit 350 in FIG. 3B.

Figure 4A:
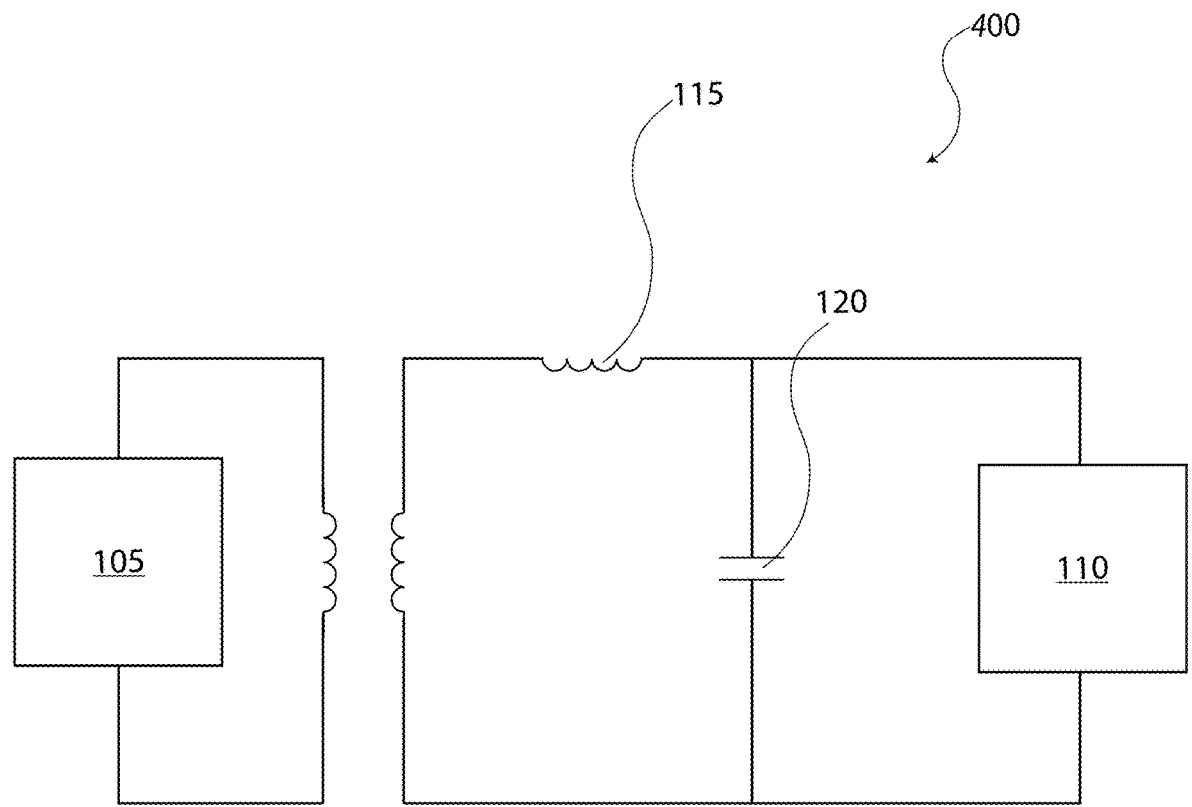
FIGS. 4A and 4B are block diagrams of example high voltage waveform generators according to some embodiments.

FIG. 4A is a block diagram of an example high voltage waveform generator 400 according to some embodiments. In this example, the high voltage waveform generator 400 includes a transformer 121 between the nanosecond pulser 105 and the load 110. Either the generator L and or C may be present, and/or C might be in series with the load 110, for example. In some embodiments, the pulse generator 105 may also contain a transformer that may galvanically isolate the pulser output from its input.

Figure 4B:
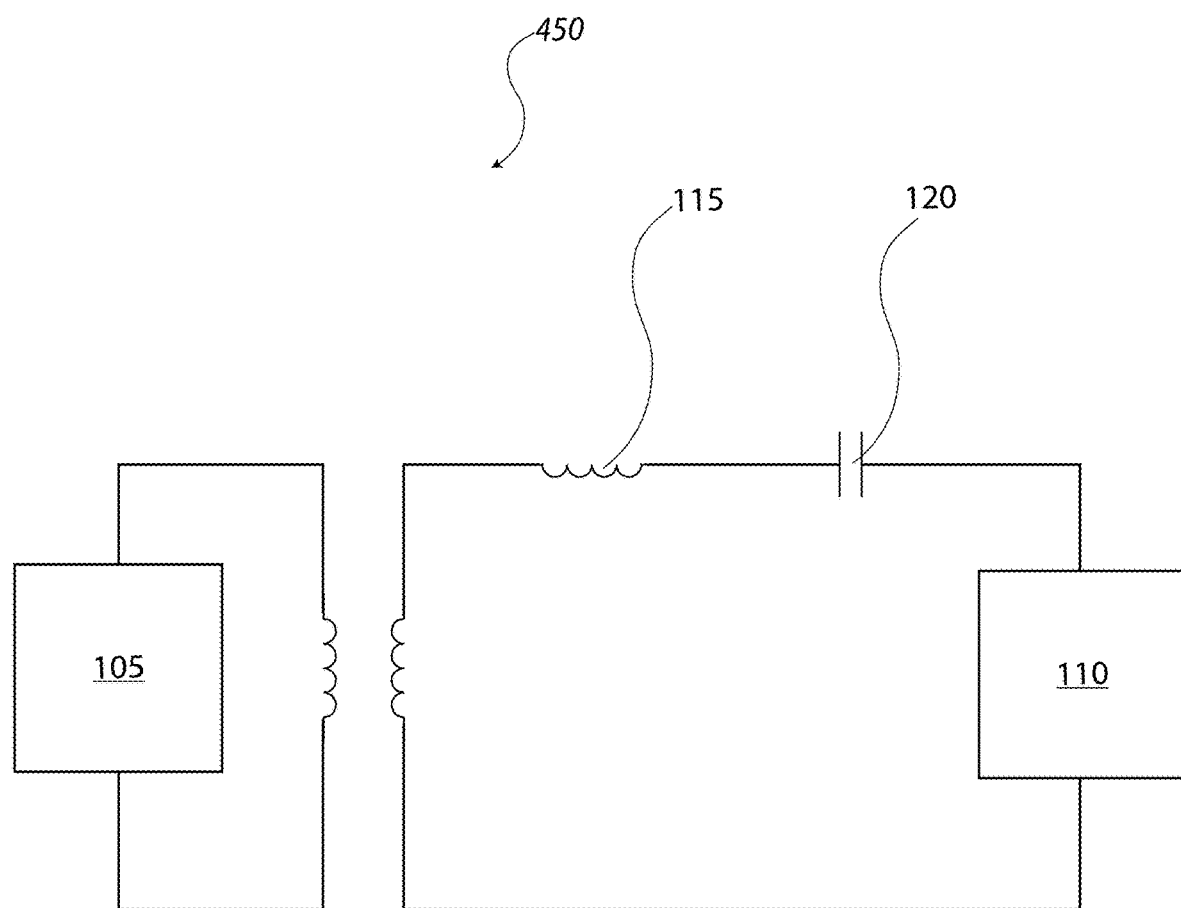

In some embodiments, the generator capacitor 120 may be in series with the load 110 as shown in circuit 450 as shown in FIG. 4B.

Figure 5A:
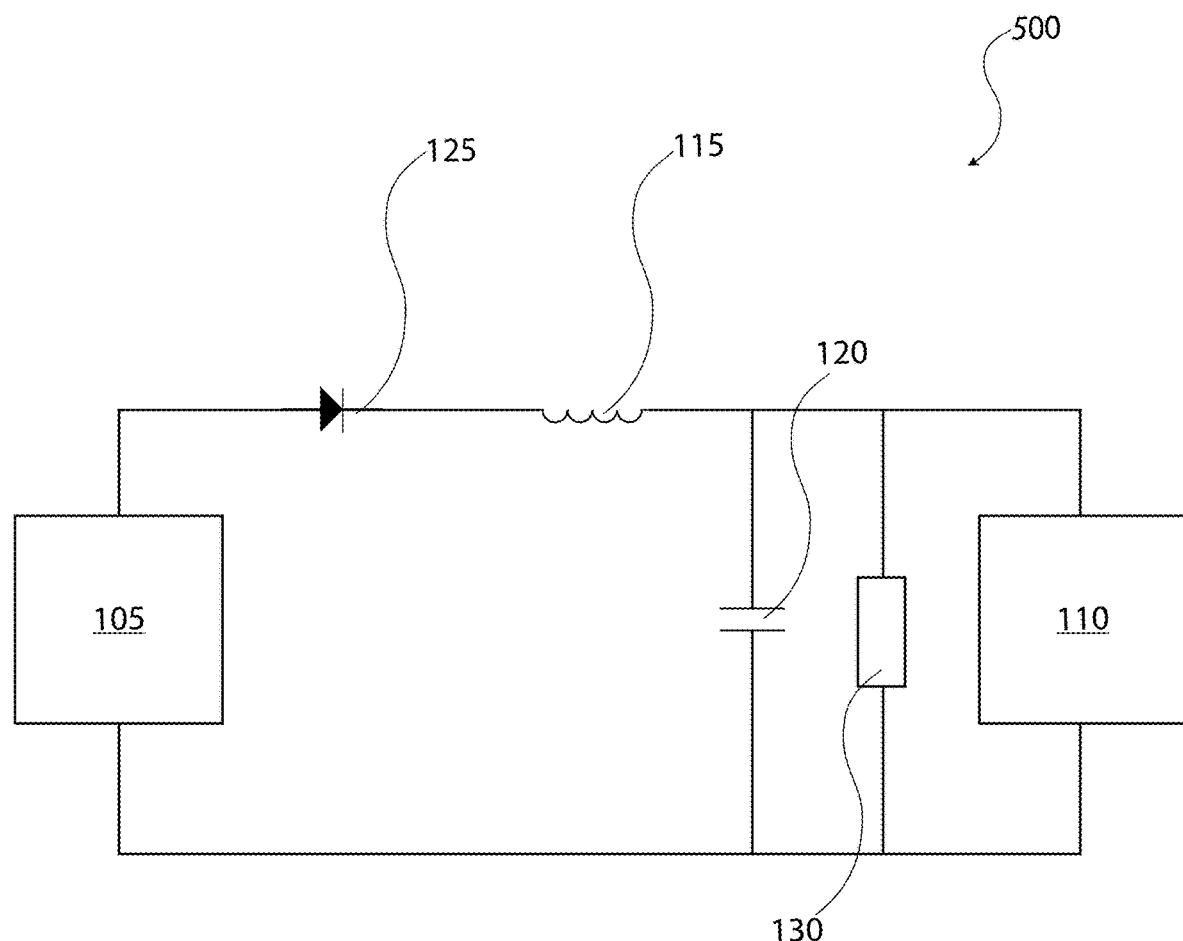
FIGS. 5A and 5B are block diagrams of example high voltage waveform generators according to some embodiments.

FIG. 5A is a block diagram of an example high voltage waveform generator 500 according to some embodiments. In this example, the high voltage waveform generator 500 includes a pulldown resistor 130. A switch may also be included in series with the pulldown resistor 130. The pulldown resistor 130 may, for example, include any embodiment described in U.S. patent application Ser. No. 15/941,731, titled "HIGH VOLTAGE PASSIVE OUTPUT STAGE CIRCUIT", which is incorporated into this disclosure in its entirety for all purposes.

Figure 5B:
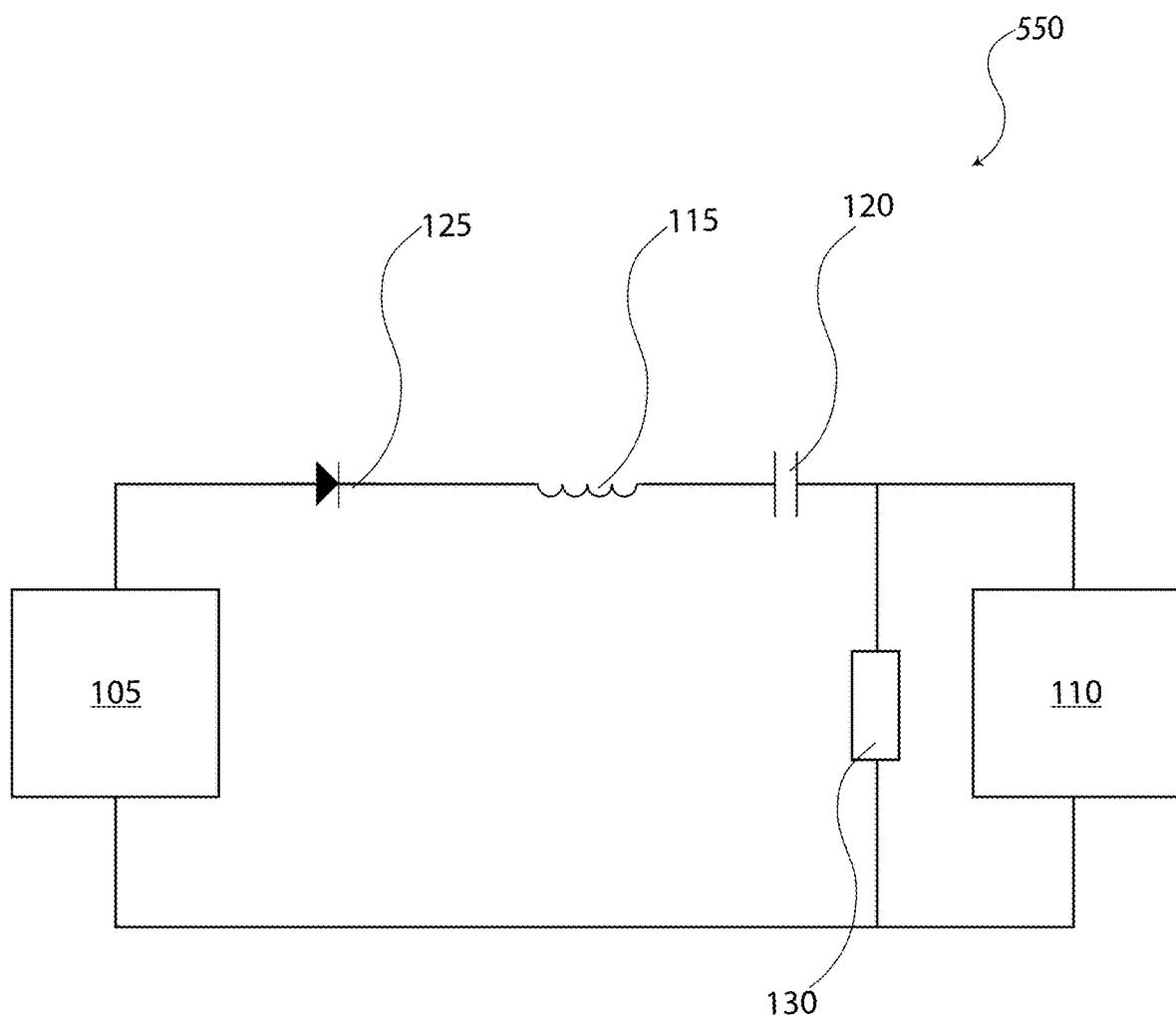

In some embodiments, the generator capacitor 120 may be in series with the load 110 as shown in circuit 550 in FIG. 5B. In some embodiments, the generator capacitor 120 may be part of the load 110 and/or include all or part of the capacitance of the load 110. In some embodiments, the pull down resistor 130 may be placed before the generator capacitor 120, the effective load capacitance 115, and/or the diode 125, i.e. placed closer to generator 105.

Figure 6:
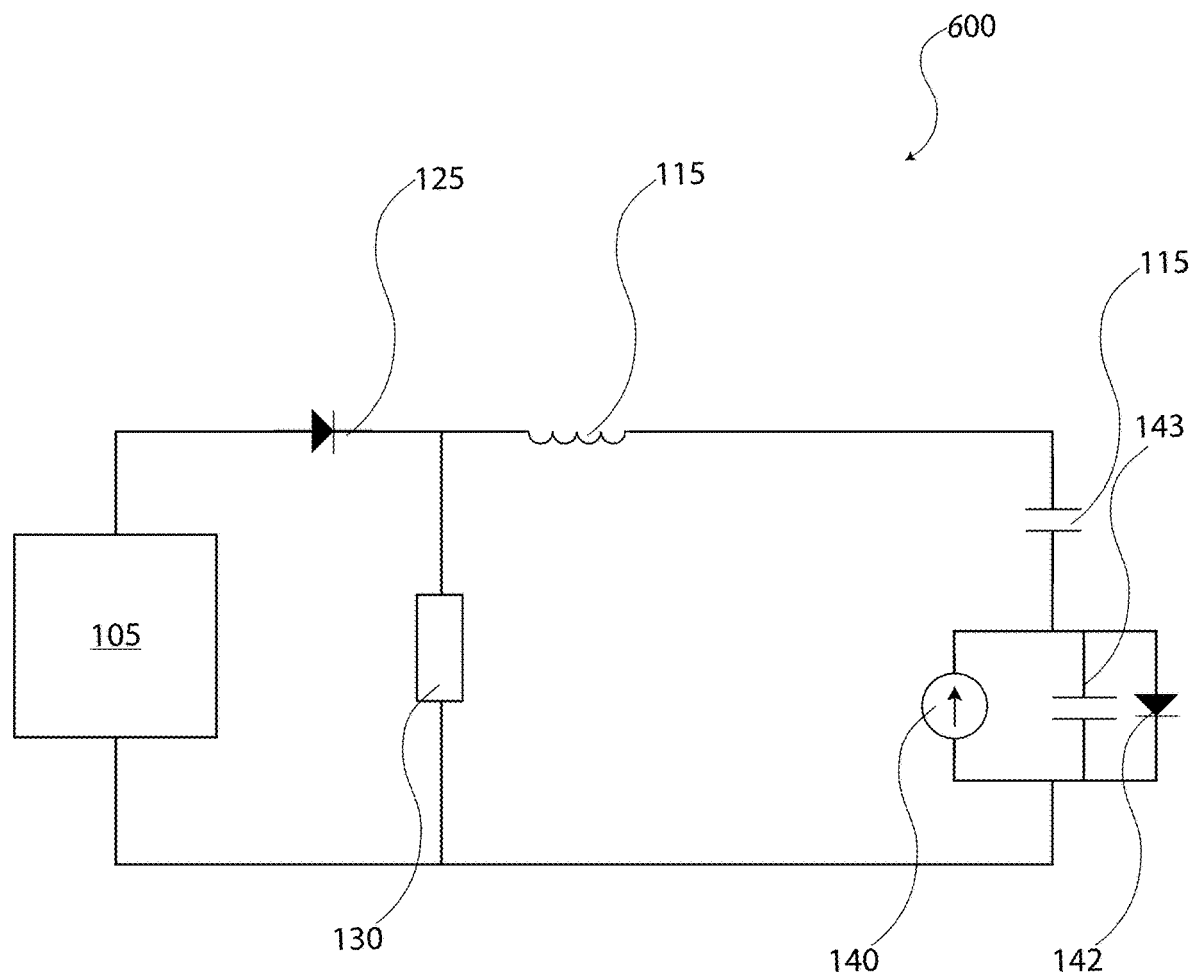
FIG. 6 is a block diagram of an example high voltage waveform generator according to some embodiments.

FIG. 6 is a block diagram of an example high voltage waveform generator 600 according to some embodiments. In this example, the high voltage waveform generator 600 may include a load having an effective load capacitance 115, an effective load current generator 140, and/or an effective load diode 142 and an effective system inductance 115. A plasma, for example, may be idealized by the effective current generator 140, the effective load diode 142, and the effective load capacitance 143. In some embodiments, the effective current generator 140 can represent the plasma ion current. In some embodiments, the ion plasma current can flow fairly steadily between the input pulses, for around the duration of the output pulse. In some embodiments, the effective load capacitance 143 can represent the capacitance formed in the plasma. In some embodiments, effective load capacitance 115 can represent the capacitance across the material/item/component being treated by the plasma, for example a semiconductor wafer being etched. In some embodiments, the effective load diode 142 can represent the electron mobility within the plasma, and/or the flow of current through the plasma driven by the input nanosecond pulses, that occurs around the duration of the input pulse burst.

Figure 7:
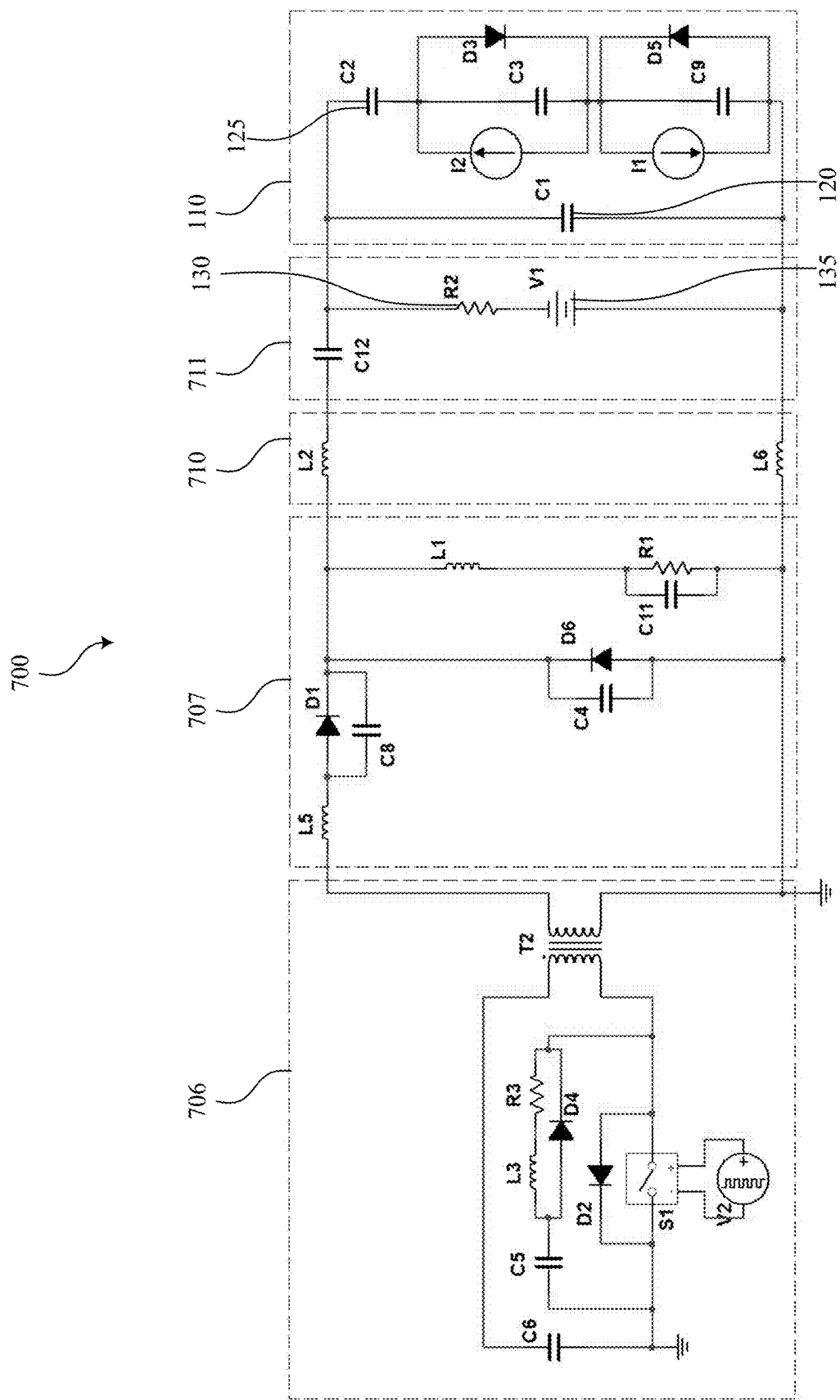
FIG. 7 is a circuit diagrams of an example high voltage waveform generator according to some embodiments.

FIG. 7 shows another example high voltage waveform generator 700 according to some embodiments. The high voltage waveform generator 700 can be generalized into five stages (these stages could be broken down into other stages or generalized into fewer stages). The high voltage waveform generator 700 includes pulser and transformer stage 706, a resistive output stage 707, a lead stage 710, a blocking capacitor and DC bias power supply stage 711, and a load stage 110.

In this example, the load stage 110 may represent an effective circuit for a plasma deposition system, plasma etch system, or plasma sputtering system. In some embodiments, the capacitance of capacitor C1 and/or capacitor C12 may be less than about 50 µF, 10 µF, 1 µF, 100 nF, etc. The capacitor C2 may represent the capacitance of the dielectric material upon which a wafer may sit. In some embodiments, the capacitor C2 may be less than about 50 µF, 10 µF, 1 µF, 100 nF, etc. The capacitor C3 may represent the sheath capacitance of the plasma to the wafer. In some embodiments, the capacitor C3 may be less than about 50 µF, 10 µF, 1 µF, 100 nF, etc. The capacitor C9 may represent capacitance within the plasma between a chamber wall and the top surface of the wafer. The current source I2 and the current source I1 may represent the ion current through the sheath.

In this example, the resistive output stage 707 may include one or more inductive elements represented by inductor L1 and/or inductor L5. The inductor L5, for example, may represent the stray inductance of the leads in the resistive output stage 707. Inductor L1 may be set to minimize the power that flows directly from the pulser and transformer stage 706 into resistor R1. In some embodiments, the resistance of resistor R1 can be less than about 2,000 Ohms, 200 Ohms, 20 Ohms, 2 Ohms, etc.

In some embodiments, the inductor L2, inductor L5, and/or inductor L6 may have an inductance less than about 100 µH, 10 µH, 1 µH, 100 nH, etc.

In some embodiments, the resistor R1 may dissipate charge from the load 110, for example, on fast time scales (e.g., 1 ns, 10 ns, 100 ns, 250 ns, 500 ns, 1,000 ns, etc. time scales). The resistance of resistor R1 may be low to ensure the pulse across the load 110 has a fast fall time $t_f$.

In some embodiments, the resistor R1 may include a plurality of resistors arranged in series and/or parallel. The capacitor C11 may represent the stray capacitance of the resistor R1 including the capacitance of the arrangement series and/or parallel resistors. The capacitance of stray capacitance C11, for example, may be less than 2000 pF, 500 pF, 250 pF, 100 pF, 50 pF, 10 pF, 1 pF, etc. The capacitance of stray capacitance C11, for example, may be less than the load capacitance such as, for example, less than the capacitance of C2, C3, and/or C9.

In some embodiments, a plurality of pulser and transformer stages 706 can be ganged up in parallel and coupled with the resistive output stage 707 across the inductor L1 and/or the resistor R1. Each of the plurality of pulser and transformer stages 706 may each also include diode D1 and/or diode D6. In some embodiments, the inductance of inductor L1 can be less than about 1,000 μH, 100 μH, 10 μH, etc.

In some embodiments, the capacitor C8 may represent the stray capacitance of the blocking diode D1. In some embodiments, the capacitor C4 may represent the stray capacitance of the diode D6.

In some embodiments, the DC bias power supply stage 711 may include DC a voltage source V1 that can be used to bias the output voltage either positively or negatively. In some embodiments, the capacitor C12 isolates/separates the DC bias voltage from the resistive output stage and other circuit elements. The capacitor C12 may be referenced as either a blocking capacitor and/or a bias capacitor. In some embodiments, capacitor C12 may comprise a single capacitive element, or numerous capacitive elements combined. In some embodiments, capacitor C12 may allow for a potential shift from one portion of the circuit to another. In some embodiments, the potential shift capacitor C12 establishes may be used to hold a wafer in place using electrostatic forces. In some embodiments, the capacitance of capacitor C12 may be less than about 1000 μF, 100 μF, 10 μF, 1 μF, etc.

Resistance R2 may protect/isolate the DC bias supply from the high voltage pulsed output from the pulser and transformer stage 706. In some embodiments, the DC bias power supply stage may contain additional elements such as switches, diodes, and capacitors, to help keep the electrostatic forces holding a wafer in place fairly constant in time, as the output pulse cycles on and off such as, for example, U.S. Patent Application Ser. No. 62/711,406, filed Aug. 10, 2018, titled "NANOSECOND PULSER BIAS COMPENSATION", which is incorporated into this disclosure in its entirety for all purposes.

In some embodiments, the pulser and transformer stage 706 may include a plurality of switches and a plurality of signal generators. A plurality of switches, for example, may allow the nanosecond pulser to produce higher frequency pulses.

In some embodiments, the voltage source V2 provides a consistent DC voltage that is switched by switch S1. Switch S1, for example, may include one or more solid state switches such as, for example, an IGBT, a MOSFET, a SiC MOSFET, SiC junction transistor, FETs, SiC switches, GaN switches, photoconductive switch, etc. Switch S1 may switch so fast that the switched voltage may never be at full voltage. For example, if voltage source V2 provides a DC voltage of 500 V, then the switch S1 may be turned on and turned off so quickly that the voltage across the switch is less than 500 V. In some embodiments, a gate resistor coupled with the switch S1 may be set with short turn on pulses.

Figure 8A:
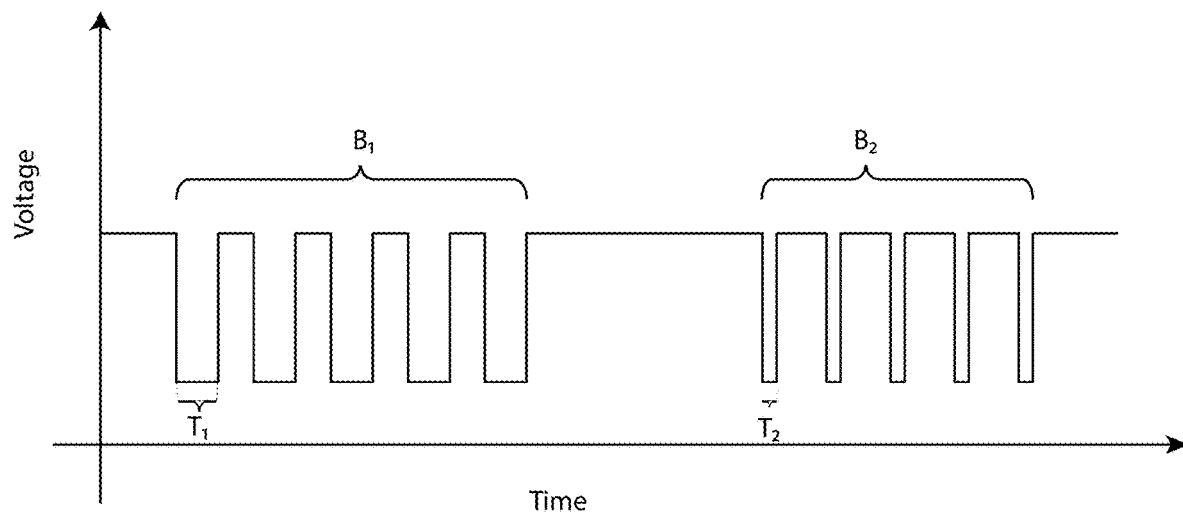
FIG. 8A illustrates an example pulser waveform and an example high voltage waveform generator output waveform according to some embodiments.
Figure 8B:
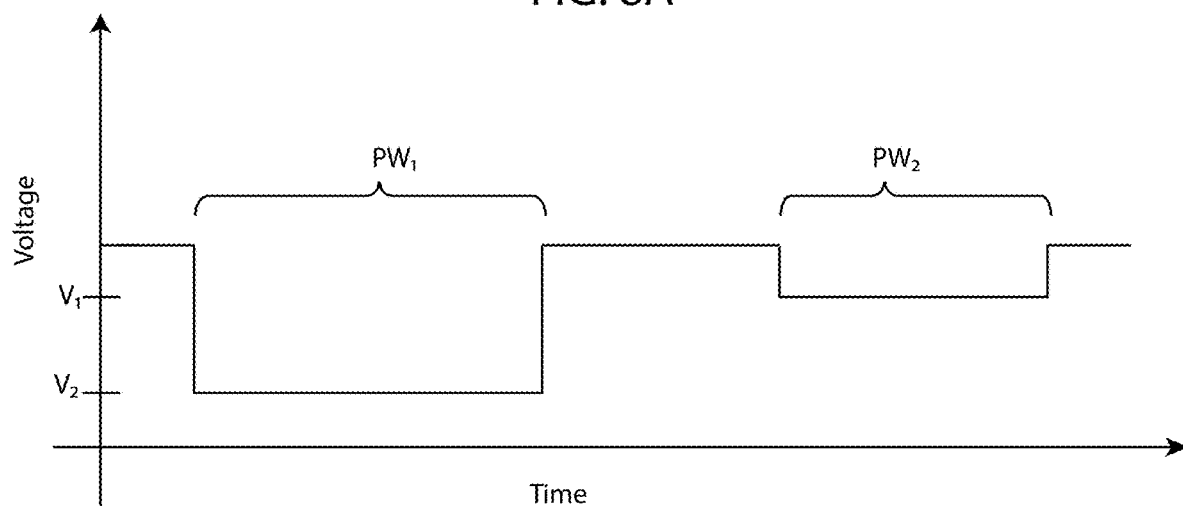
FIG. 8B illustrates an example high voltage waveform generator output waveform according to some embodiments.

FIG. 8A illustrates an example pulser waveform and FIG. 8B illustrates an example high voltage waveform generator output waveform according to some embodiments. In this example, the waveform produced by the pulser include two bursts: a first burst with a burst period $B_1$ with each pulse having a pulse width $T_1$; and a second burst with a burst period $B_2$ with each pulse having a pulse width $T_2$. The waveform output is the output of the waveform generator based on the waveform produced by the pulser. In this example, the waveform generator outputs two pulses: a first pulse having a pulse width $PW_1$ and a voltage $V_1$; and a second pulse having a pulse width $PW_2$ and a voltage $V_2$. In this example, the $MY'$ is the same length as the burst period $B_1$ within 10%; and the first pulse voltage $V_1$ is a function of (e.g., proportional to) the pulse width $T_1$. In addition, the $PW_2$ is the same length as the burst period $B_2$ within 10%; and the first pulse voltage $V_2$ is a function of (e.g., proportional to) the pulse width $T_2$. $PW_1$ and $PW_2$ may have widths that deviate from $B_1$ and $B_2$ due to circuit phase delays, and the charging and discharging of various circuit elements. However, the input and output lengths are strongly correlated, with the input burst lengths being used to control the output pulse lengths. Load properties will also impact the exact correlation between the input burst width and the output pulse width. The flatness of the output pulses may also vary based on the circuit elements selected, and/or may show a natural oscillation/response to the input pulses that comprise the burst.

In some embodiments, the time between pulses can be any value. In some embodiments, the time between pulses can be on the order of the pulse width of an individual pulse.

In some embodiments, the frequency of the pulses within each burst may be greater than about 1 kHz, 10 kHz, 100 kHz, 1,000 kHz, etc.

Figure 8C:
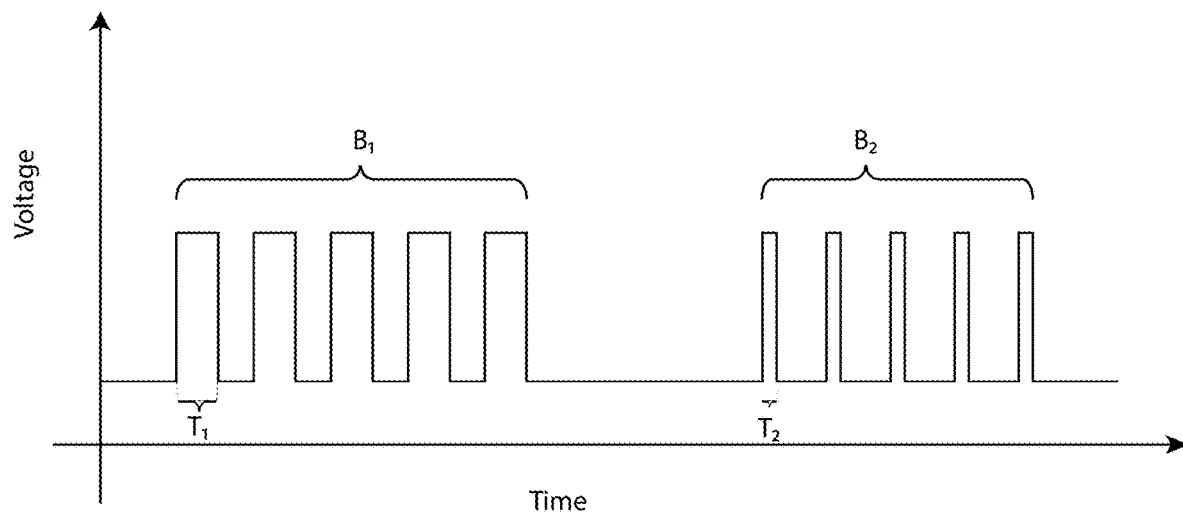
FIG. 8C illustrates an example pulser waveform according to some embodiments.
Figure 8D:
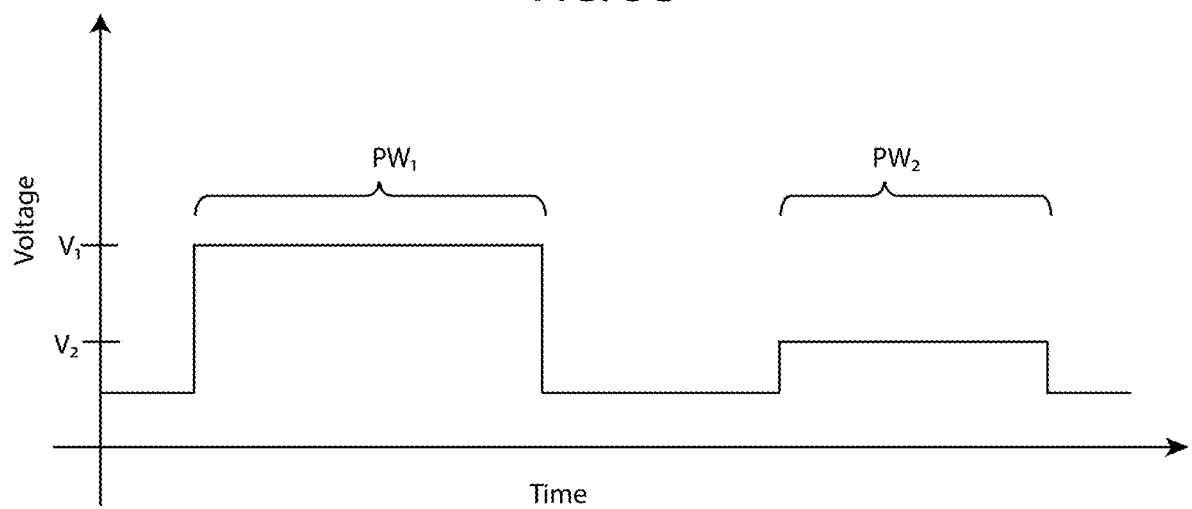
FIG. 8D illustrates an example high voltage waveform generator output waveform according to some embodiments.

FIG. 8C illustrates an example pulser waveform and FIG. 8D illustrates an example high voltage waveform generator output waveform according to some embodiments. In this example, the input waveforms are inverted in comparison with those shown in FIG. 8A, resulting in inverted output waveforms shown in FIG. 8D. In this example, the pulse widths of the output pulses $PW_1$ and $PW_2$ are substantially similar to the burst period Bland $B_2$. The waveforms shown in FIGS. 9, 10, and 11 can likewise be inverted. The flatness of the output pulses may also vary based on the circuit elements selected, and/or may show a natural oscillation/response to the input pulses that comprise the burst.

Figure 9A:
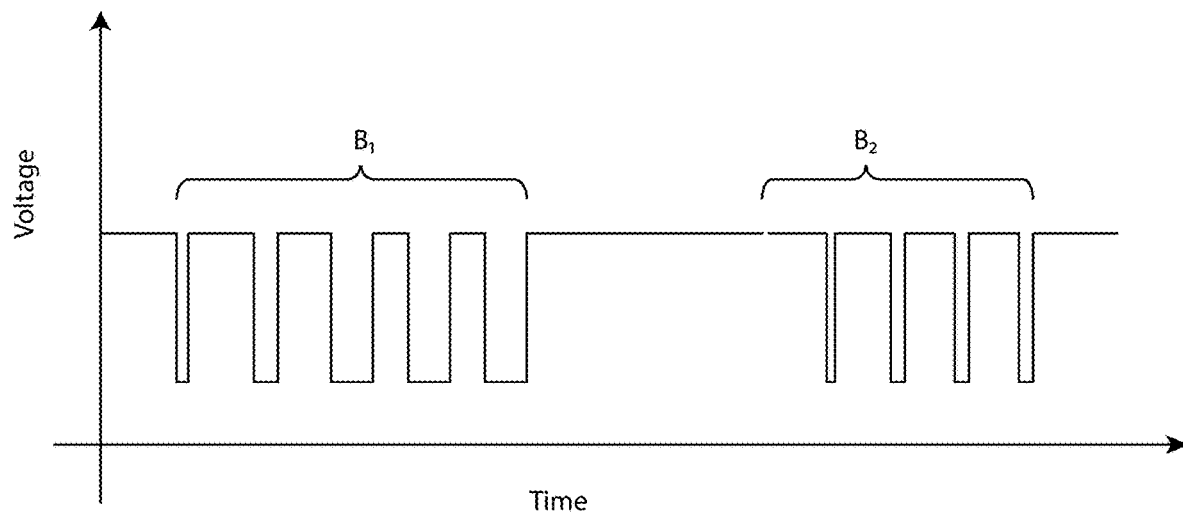
FIGS. 9A and 9B illustrate an example pulser waveform and an example high voltage waveform generator output waveform according to some embodiments.
Figure 9B:
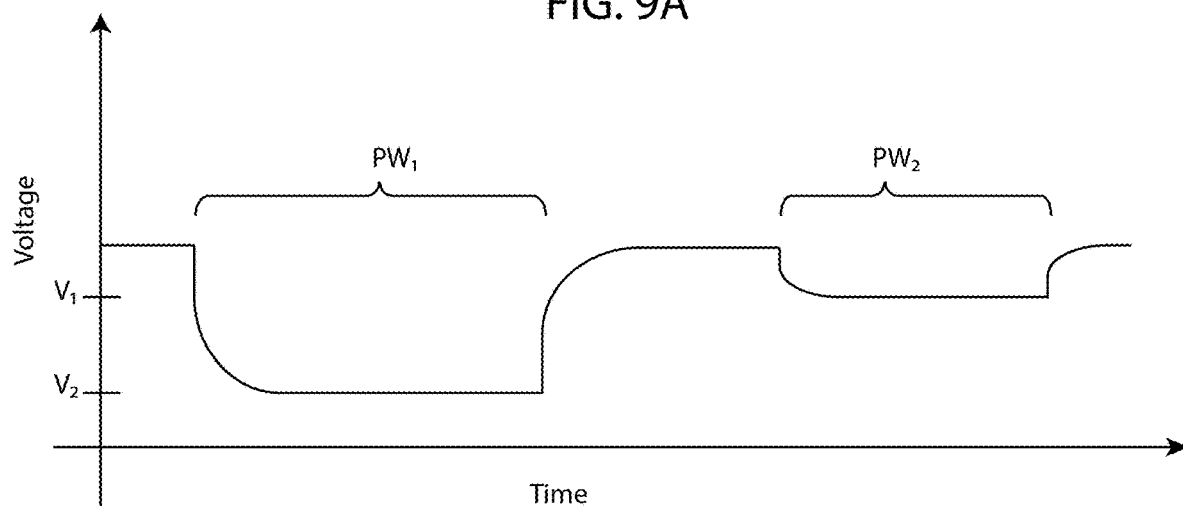

FIG. 9A illustrates an example waveform produced by the pulser and FIG. 9B illustrates an example high voltage waveform generator output waveform according to some embodiments. In this example, the first two pulses of the first burst of the pulser output as shown in FIG. 9A are shorter than the other pulses within the burst. This results in an output pulse that slowly ramps up to $V_2$ or $V_1$ as shown in FIG. 9B. This may be done to limit the peak output current and/or energy from the pulser.

The output waveforms shown in FIGS. 8B, 8D, and 9B may be referred to as a form of 'bi-level' control, where the intent is to apply a series of 1 or more output pulses of one voltage alternating with a series of one or more output pulses with a different voltage. For example, this may allow high energy ions to interact with a surface/material, followed by low energy ions interacting with a surface/material.

Figure 10A:
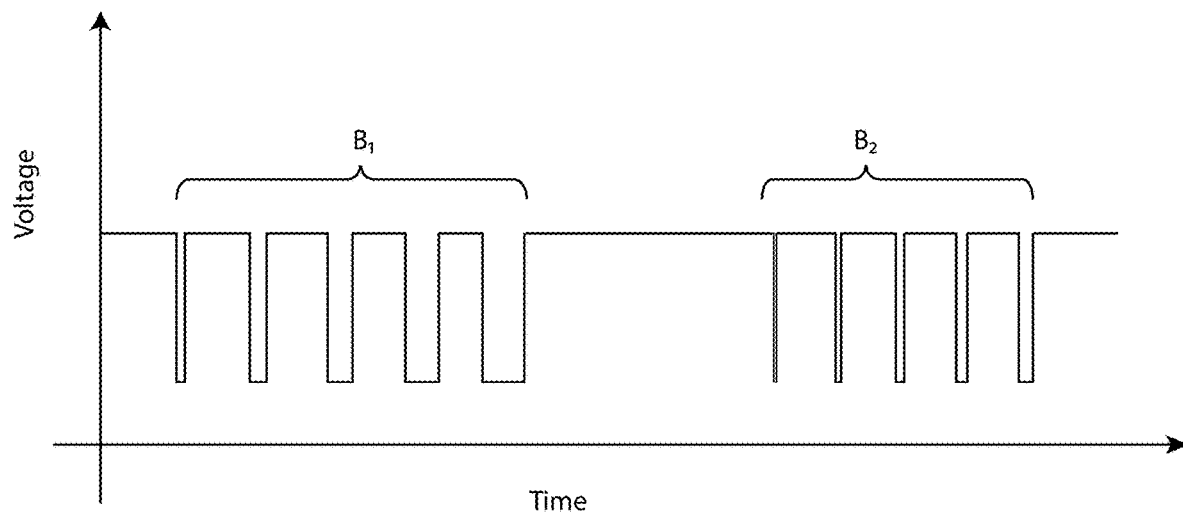
FIGS. 10A and 10B illustrate an example pulser waveform and an example high voltage waveform generator output waveform according to some embodiments.
Figure 10B:
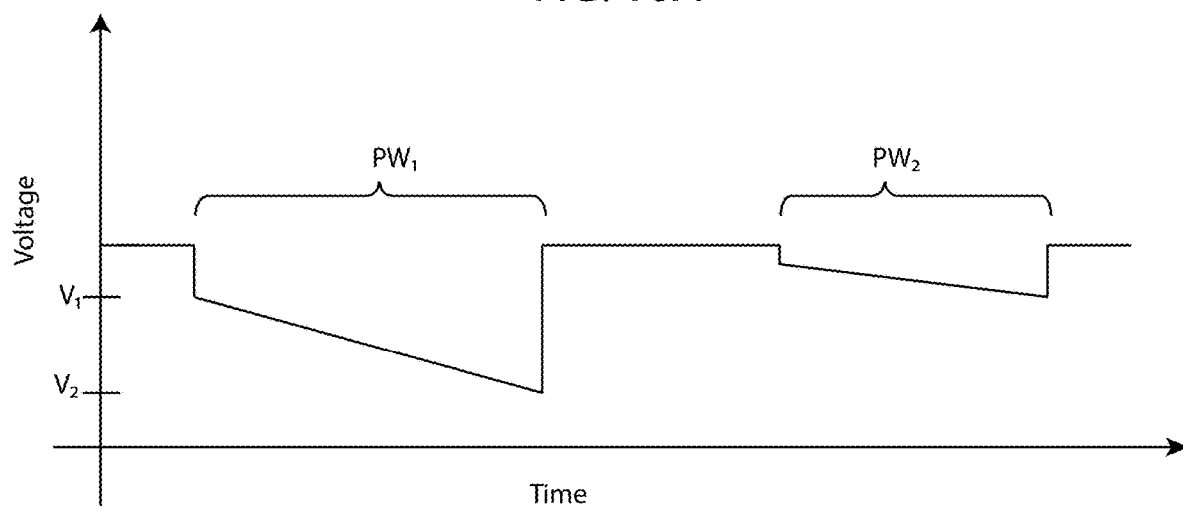

FIG. 10A illustrates an example waveform produced by the pulser and FIG. 10B illustrates an example high voltage waveform generator output waveform according to some embodiments. In this example, the pulse width of each pulse within a burst increases linearly as shown in FIG. 10A resulting in an output waveform voltage that similarly decreases linearly as shown in FIG. 10B.

Figure 11A:
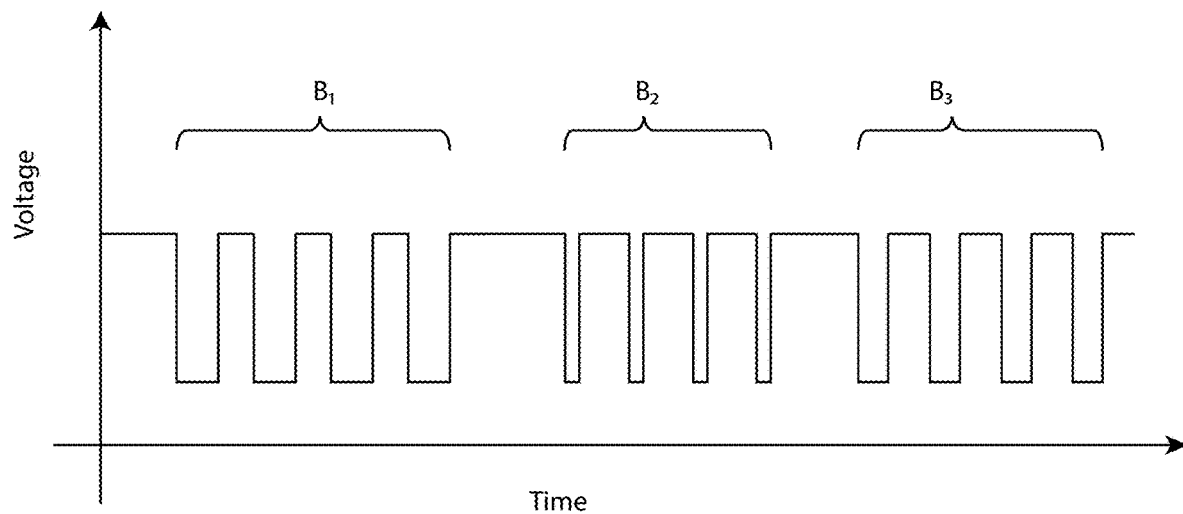
FIGS. 11A and 11B illustrate an example pulser waveform and an example high voltage waveform generator output waveform according to some embodiments.
Figure 11B:
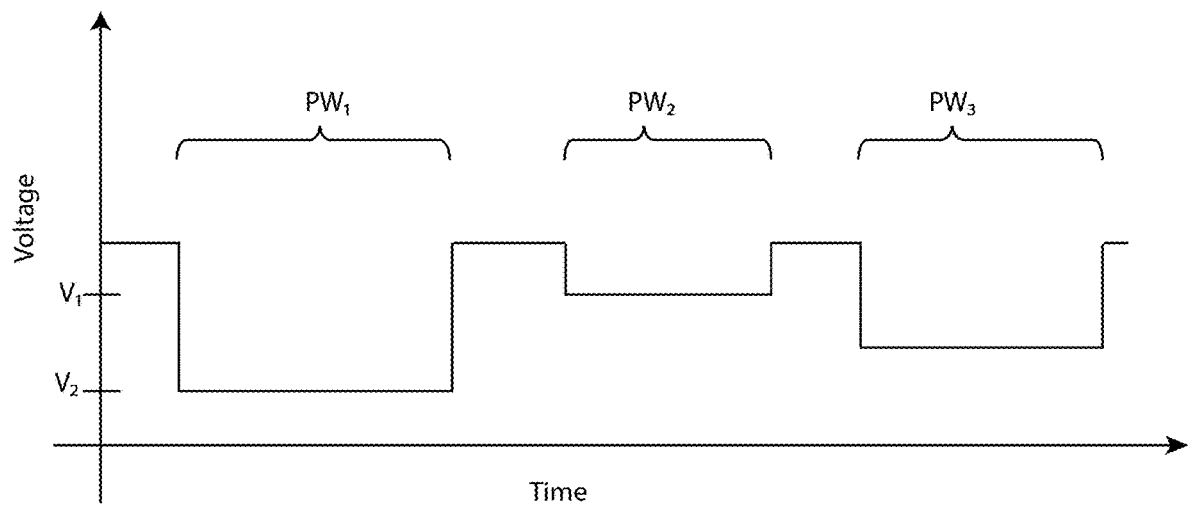

FIG. 11A illustrates an example waveform produced by the pulser and FIG. 11B illustrates an example high voltage waveform generator output waveform according to some embodiments. In this example, three bursts having three different burst widths and the pulses within each burst have different pulse widths as shown in FIG. 11A. This results in three output pulses with three different pulse widths and different voltages as shown in FIG. 11B.

The shape of the output waveform can be dictated by the pulse width of each pulse within a burst and/or the burst width. Any shape of output waveform may be produced by varying these parameters. Such shapes may be repeated and interleaved with any other set of output pulse shapes, and may be done so in a repetitive manner. In some embodiments, the shape of the output waveform can be controlled/set by varying the voltage of the individual pulses. Varying the pulse width may vary the pulse voltage as well.

In some embodiments, multiple nanosecond pulsers may be phased together. For example, the nanosecond pulser 105 may include one or more pulsers phased together in parallel. This may, for example, generate output pulses from the waveform generator at higher frequencies.

Figure 12:
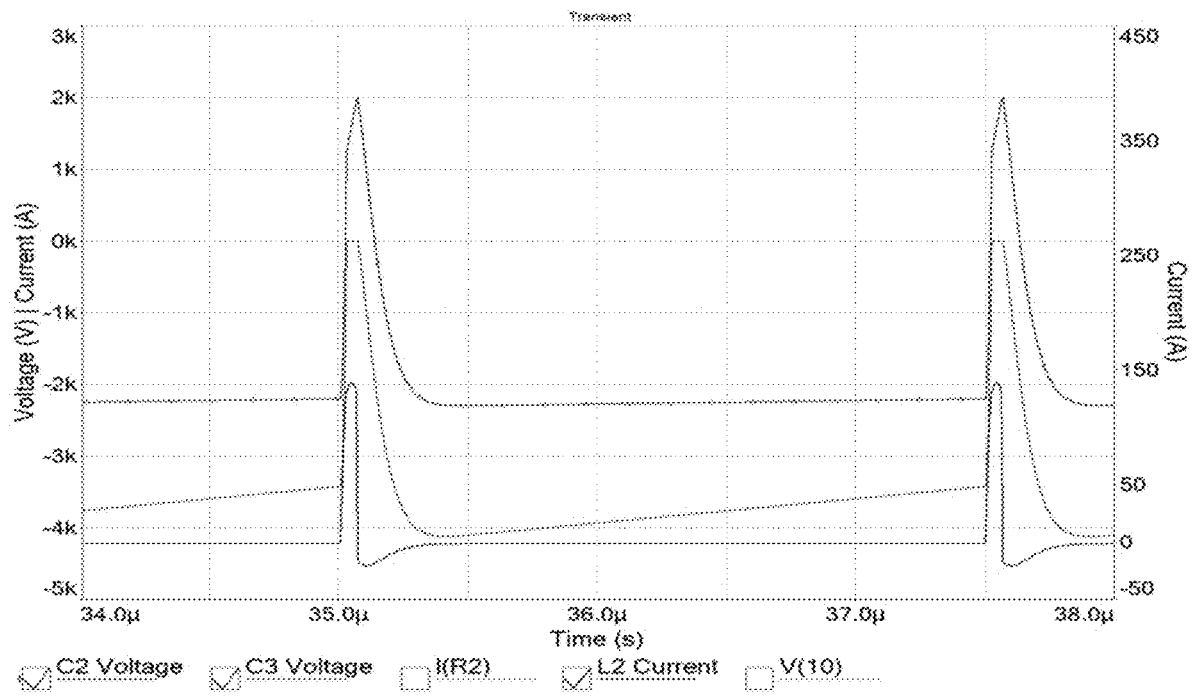
FIG. 12 illustrates example waveforms within various circuit elements of a high voltage waveform generator according to some embodiments.

FIG. 12 illustrates example waveforms within various circuit elements of a high voltage waveform generator according to some embodiments. The waveforms shown in FIG. 12 relate to the components shown in FIG. 7.

Figure 13:
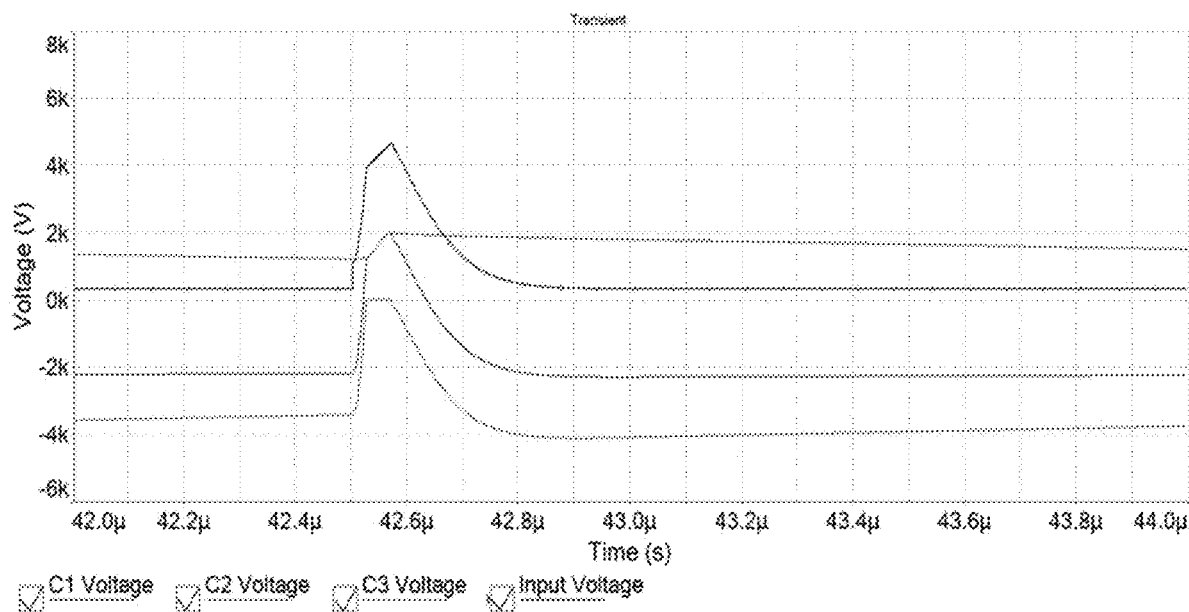
FIG. 13 illustrates example waveforms within various circuit elements of a high voltage waveform generator according to some embodiments.
Figure 14:
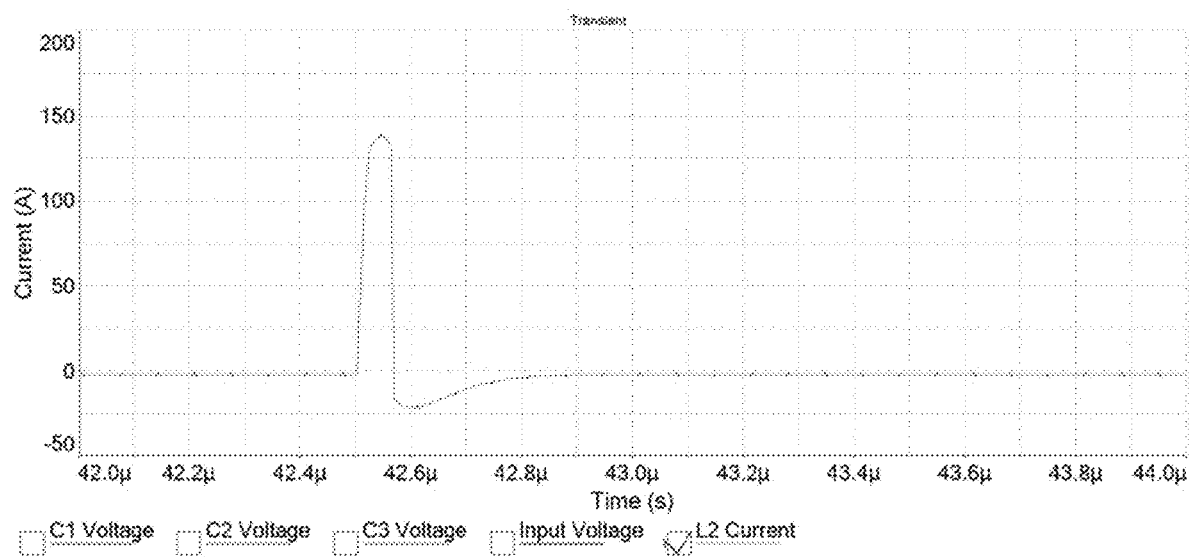
FIG. 14 illustrates example waveforms within various circuit elements of a high voltage waveform generator according to some embodiments.

FIG. 13 and FIG. 14 illustrates example waveforms within various circuit elements of a high voltage waveform generator according to some embodiments. The waveforms shown in FIG. 12 relate to the components shown in FIG. 7.

In some embodiments, a high voltage waveform generator may use real time feedback to adjust the output voltage of an output waveform. For example, a circuit can determine that the voltage of an output waveform is lower than expected, in response the pulse width of the nanosecond pulser may be adjusted to produce the desired output pulse. Alternatively, the number of pulses within a burst may be adjusted, and/or their frequency may be adjusted.

In some embodiments, a plurality of pulsers may be used in a high voltage waveform generator 750. For example, a first pulser and a second pulser can be phased together with one or more switches. Linking together these pulses can be done to increase the frequency of the pulses provided to the load. In some embodiments, each of the pulsers may produce a different drive voltage.

In some embodiments, the resistor at the gate of one or more MOSFETs within the pulser may be selected to enable a working range between high levels and low levels in bi-level operation. In some embodiments, the resistor at the gate of one or more MOSFETs may provide short circuit protection. In some embodiments, different gate voltages may be applied to one or more MOSFETs within the pulser.

Figure 15A:
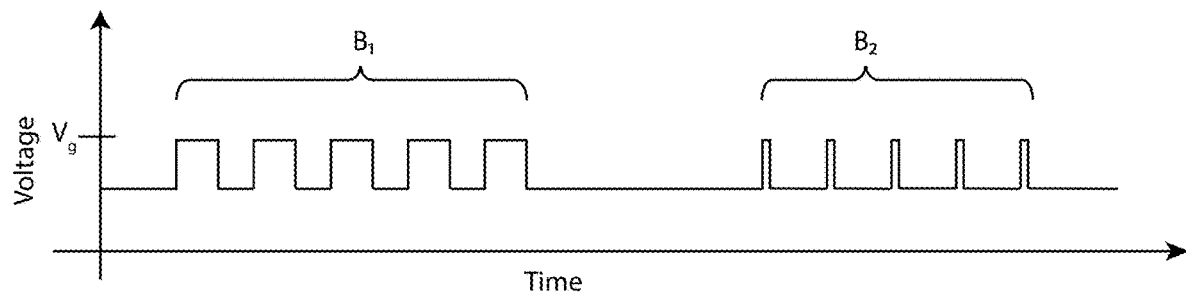
FIGS. 15A-15D illustrates an example pulser waveform and an example high voltage waveform generator output waveform according to some embodiments.
Figure 15B:
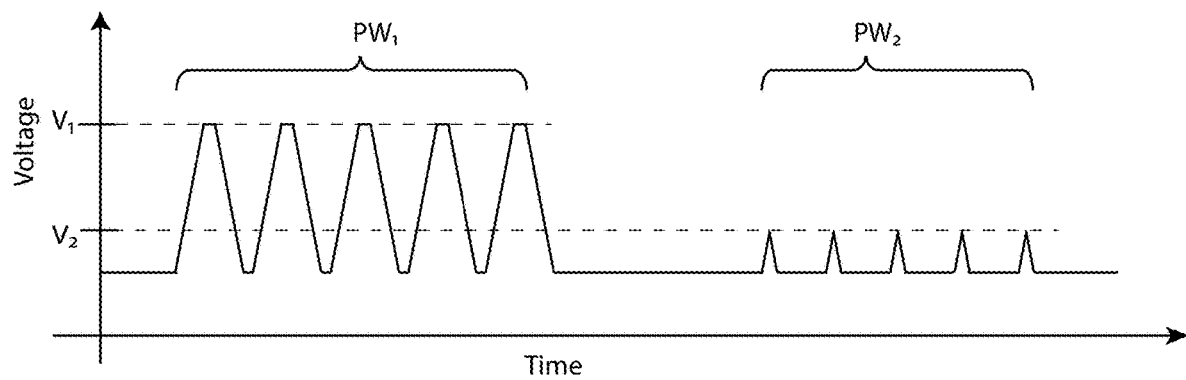
Figure 15C:
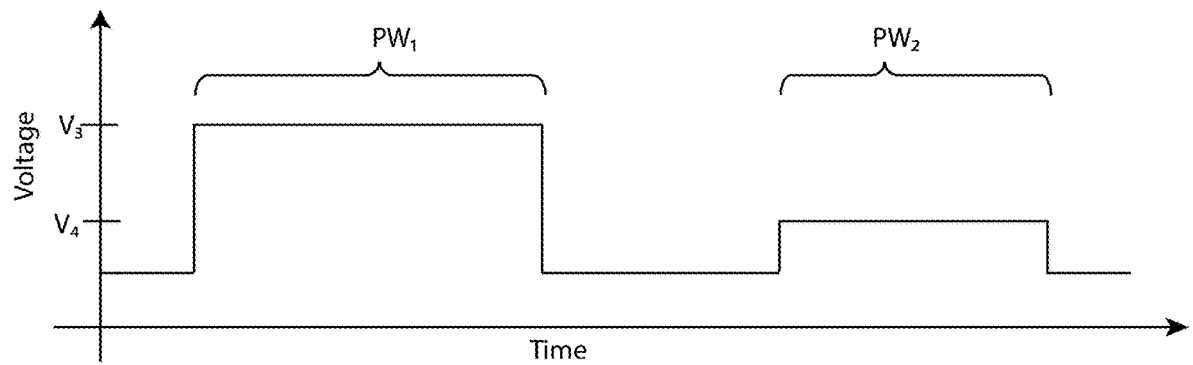

In some embodiments, the turn on time of one or more switches within the nanosecond pulser 105 may result in lower output voltage from the pulser when the pulse width is less than the rise time. This is illustrated in FIG. 15C. $V_3$, for example, may be 5 kV or greater and $V_4$, for example, may be greater than 200 volts.

Figure 15D:
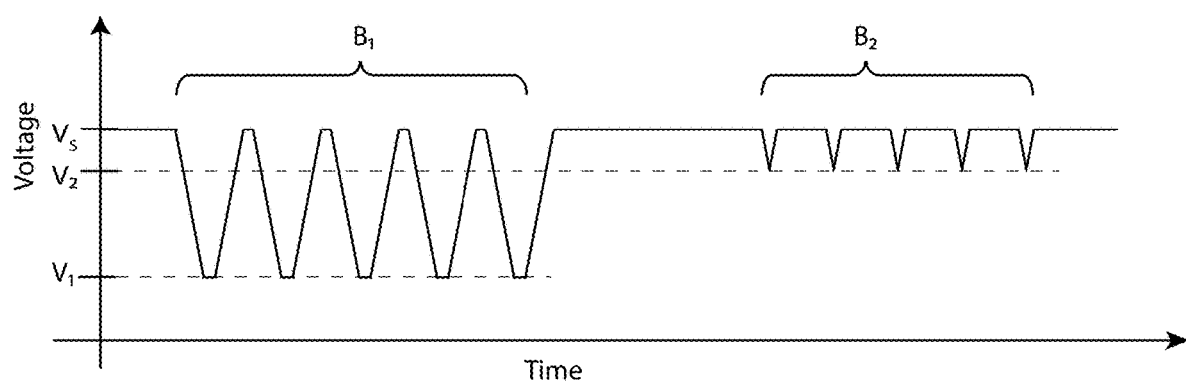

A pulser may include a high voltage DC input and a low voltage DC waveform for controlling the solid-state switches or gate voltage. The waveform shown in FIG. 15A shows the gate voltage with two bursts each having a burst period, $B_1$ and $B_2$, and the pulses within each burst having a different pulse width. The waveform in FIG. 15B shows example pulses produced by the pulser (e.g., the voltage across R1 in FIG. 7). The voltage of the pulses within the first burst are at $V_1$ and the pulses within the second burst are at $V_2$. The pulse voltages in the second burst are lower because the gate voltage pulse widths are shorter. Specifically, the gate voltage pulses are sufficiently short that the pulser switches do not have time to fully turn on, (e.g., reach their peak output voltage) before the pulse switches are turned back off by the gate input pulse. The waveform in FIG. 15D is the voltage across the switch in the pulser (e.g., switch S1 in FIG. 7). The switches are gated on for a sufficiently short period that the voltage across the switch is never able to fall to the low level that it would normally be for a switch fully turned on and in full conduction. The resulting output waveform shown in FIG. 15C has two voltage levels. The second voltage level is a function of the pulse width of the gate voltage waveform (FIG. 15A). Because the pulse widths of the second pulses are shorter than the switch rise time, or the switch turn-on time, or the switch time needed to reach full conduction, lower voltage pulses are produced by the pulser. The second voltage level in FIG. 15C is a function of the pulse width and the voltage produced by the pulser shown in FIG. 15B. The gate resistance of one or more switches in the pulser may determine the rise time and voltage of the pulses provided by the pulser.

In some embodiments, the output voltage shown in FIG. 15C is a function of single pulses shown in FIG. 15A. In some embodiments, output voltage control is provided using the switches to control output voltage. Some embodiments may enable very fast, nanosecond timescale, output voltage modulation, at bi-level voltage output. This can, for example, allow for fast voltage modulation (e.g., greater than 1 MHz).

Numerous specific details are set forth herein to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

The terms "first" and "second" are not necessarily used to identify the absolute or very first or second of sequence of items. Rather, these terms are used solely to label an item and a different or subsequent item unless the meaning is clear that the terms are meant to specify a specific order or absolute position. The order of the items labeled with "first" and "second" may or may not be the absolute order and/or may include other items in between.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. An apparatus to apply a periodic voltage comprising:
a switch coupled to a first node and a second node;
a first voltage source coupled to the first node and third node; and
a second voltage source coupled to the second node and the third node;
wherein the switch is closed to connect and disconnect a current pathway between the first node and the second node to cause an application of an asymmetric periodic voltage waveform at the second node relative to the third node,
wherein each cycle of the asymmetric periodic voltage waveform that includes at least the following a first portion that begins with a first negative voltage and changes to a positive peak voltage, a second portion that changes from the positive peak voltage to a third voltage level and a fourth portion that includes a negative voltage ramp from the third voltage level to a fourth voltage level.

2. The apparatus of claim 1, wherein connecting the current pathway between the first node and the second node causes the first portion of the asymmetric periodic voltage waveform that begins with a first negative voltage and changes to the positive peak voltage.

3. The apparatus of claim 2, wherein disconnecting the current pathway causes the second portion of the asymmetric periodic voltage waveform that changes from the positive peak voltage level to the third voltage level.

4. The apparatus of claim 1, further comprising a first diode and a first inductor disposed between the first node and the second node.

5. The apparatus of claim 1, further comprising a second inductor coupled between the second node and the third node.

6. The apparatus of claim 1, wherein the switch includes a plurality of switches arranged is series.

7. The apparatus of claim 1, wherein the switch includes a plurality of switches arranged in parallel.

8. A method comprising:
applying a first voltage between a first node and a third node;
applying a second voltage between the second node and a third node;
connecting and disconnecting a current pathway between the first node and the second node to cause an application of an asymmetric periodic voltage waveform at the second node, wherein each cycle of the asymmetric periodic voltage waveform includes at least a first portion that begins with a first negative voltage and changes to a positive peak voltage, a second portion that changes from the positive peak voltage to a third voltage level and a fourth portion that includes a negative voltage ramp from the third voltage level to a fourth voltage level.

9. The apparatus of claim 8, wherein the connecting and disconnecting causes unidirectional current through the current pathway between the first node and the second node.

10. The method of claim 8, wherein the connecting and disconnecting causes unidirectional current through a second current pathway between the second node and the third node.

11. A method comprising:
closing a switch to connect and disconnect a current pathway between a first node and a second node to cause an application of an asymmetric periodic voltage waveform at a second node relative to a third node, wherein each cycle of the asymmetric periodic voltage waveform that includes at least the following a first portion that begins with a first negative voltage and changes to a positive peak voltage, a second portion that changes from the positive peak voltage to a third voltage level and a fourth portion that includes a negative voltage ramp from the third voltage level to a fourth voltage level.

12. The method according to claim 11, wherein connecting the current pathway between the first node and the second node causes the first portion of the asymmetric periodic voltage waveform that begins with a first negative voltage and changes to the positive peak voltage.

13. The method according to claim 11, wherein disconnecting the current pathway causes the second portion of the asymmetric periodic voltage waveform that changes from the positive peak voltage level to the third voltage level.

* * * * *